United States Patent
Lee

(10) Patent No.: US 8,859,169 B2
(45) Date of Patent: Oct. 14, 2014

(54) PHOTOMASK HAVING PATTERNS FOR EUV LIGHT AND DUV LIGHT

(71) Applicant: Samsung Electronics Co., Ltd., Suwon-si (KR)

(72) Inventor: Seung-Yoon Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 66 days.

(21) Appl. No.: 13/757,917

(22) Filed: Feb. 4, 2013

(65) Prior Publication Data

US 2013/0236818 A1    Sep. 12, 2013

(30) Foreign Application Priority Data

Mar. 8, 2012    (KR) .................. 10-2012-0024095

(51) Int. Cl.
*G03F 1/24*    (2012.01)
*G03F 1/22*    (2012.01)

(52) U.S. Cl.
USPC .......................................................... 430/5

(58) Field of Classification Search
CPC .............. G03F 1/22; G03F 1/24; G03F 1/54
USPC ................... 430/5, 322, 394; 378/35
See application file for complete search history.

(56) References Cited

U.S. PATENT DOCUMENTS

| | | | |
|---|---|---|---|
| 6,727,047 B2 | 4/2004 | Montgomery et al. | |
| 6,969,569 B2 | 11/2005 | Montgomery et al. | |
| 7,135,256 B2 | 11/2006 | Montgomery et al. | |
| 7,947,415 B2 | 5/2011 | Amano et al. | |
| 2001/0044077 A1 | 11/2001 | Tan | |
| 2002/0071995 A1 | 6/2002 | Montgomery et al. | |
| 2010/0304277 A1* | 12/2010 | Oh | 430/5 |
| 2012/0135339 A1* | 5/2012 | Kim et al. | 430/5 |

FOREIGN PATENT DOCUMENTS

| | | |
|---|---|---|
| JP | 2006-190900 A | 7/2006 |
| JP | 2007-273652 A | 10/2007 |
| KR | 10-2004-0030047 A | 4/2004 |
| KR | 10-0801484 B1 | 1/2008 |

* cited by examiner

*Primary Examiner* — Stephen Rosasco
(74) *Attorney, Agent, or Firm* — Lee & Morse, P.C.

(57) ABSTRACT

A photomask, including a photomask substrate, a reflective layer on a front surface of a first region of the photomask substrate, the reflective layer being configured to reflect an EUV light, an absorbing pattern on the reflective layer, the absorbing pattern being configured to absorb the EUV light, and an opaque pattern directly on a front surface of a second region of the photomask substrate, the opaque pattern being configured to block a DUV light.

20 Claims, 29 Drawing Sheets

PHOTOMASK HAVING PATTERNS FOR EUV LIGHT AND DUV LIGHT

CROSS-REFERENCE TO RELATED APPLICATION

This application claims priority under 35 U.S.C. §119 to Korean Patent Application No. 10-2012-0024095, filed on Mar. 8, 2012, and entitled "Photomask Having Patterns for EUV Light and DUV Light," the entirety of which is hereby incorporated by reference.

BACKGROUND

Embodiments relate to a photomask having patterns for both an extreme ultraviolet (EUV) light and a deep ultraviolet (DUV) light.

SUMMARY

Embodiments are directed to a photomask including a photomask substrate, a reflective layer for reflecting an EUV light, the reflective layer being on a front surface of a first region of the photomask substrate, an absorbing pattern for absorbing the EUV light, the absorbing pattern being on the reflective layer, and an opaque pattern for blocking a DUV light, the opaque pattern being directly on a front surface of a second region of the photomask substrate.

The photomask substrate may be transparent to the DUV light.

The photomask substrate may be transparent to the EUV light.

The absorbing pattern may selectively expose the reflective layer.

The opaque pattern may selectively expose a surface of the photomask substrate.

The opaque pattern may absorb the EUV light.

The absorbing pattern and the opaque pattern may include a metal.

The photomask may further include an opaque layer interposed between the photomask substrate and the reflective layer.

The opaque layer and the opaque pattern may have a same vertical thickness and a same material.

The reflective layer may include a stack of unit reflective layers, and each of the unit reflective layers may include a first reflective material layer and a second reflective material layer.

The photomask may further include a capping layer between the reflective layer and the absorbing pattern, the capping layer fully covering the reflective layer.

The photomask may further include a buffer pattern between the capping layer and the absorbing pattern, wherein a side of the buffer pattern is vertically aligned with a side of the absorbing pattern.

The photomask may further include a conductive layer on a back surface of the first region of the photomask substrate.

Embodiments are also directed to a photomask including a photomask substrate, a stack of reflective layers on a front surface of the photomask substrate, the stack of reflective layers fully covering a first region of the front surface of the photomask substrate, an opaque pattern formed on the front surface of the photomask substrate, the opaque pattern selectively exposing a second region of the front surface of the photomask substrate, an absorbing pattern formed on the reflective layers, the absorbing pattern selectively exposing the stack of reflective layers, and a conductive layer formed on a back surface of the photomask substrate, wherein the photomask substrate is transparent to an EUV light and a DUV light, the absorbing pattern, the stack of reflective layers, and the opaque pattern are opaque to the DUV light, the stack of reflective layers reflect the EUV light, and the absorbing pattern and the opaque pattern absorb the EUV light.

The photomask may further include an opaque layer between the front surface of the photomask substrate and the reflective layers.

Each of the reflective layers may include a first reflective material layer and a second reflective material layer, and each of the reflective layers may have a thickness of about 6.075 to about 7.425 nm.

The opaque pattern and the absorbing pattern may have a same vertical thickness and a same material.

Embodiments are also directed to a photomask including a photomask substrate having a front surface, a first region on the front surface of the photomask substrate that reflects an EUV light and blocks a DUV light, a second region on the front surface of the photomask substrate that absorbs the EUV light and blocks the DUV light, a third region on the front surface of the photomask substrate that is transmissive to the DUV light, and a fourth region on the front surface of the photomask substrate that blocks the DUV light.

The first region may be directly adjacent to the second region, and the third region may be directly adjacent to the fourth region.

The third region may be transmissive to the EUV light and the fourth region may absorb the EUV light.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
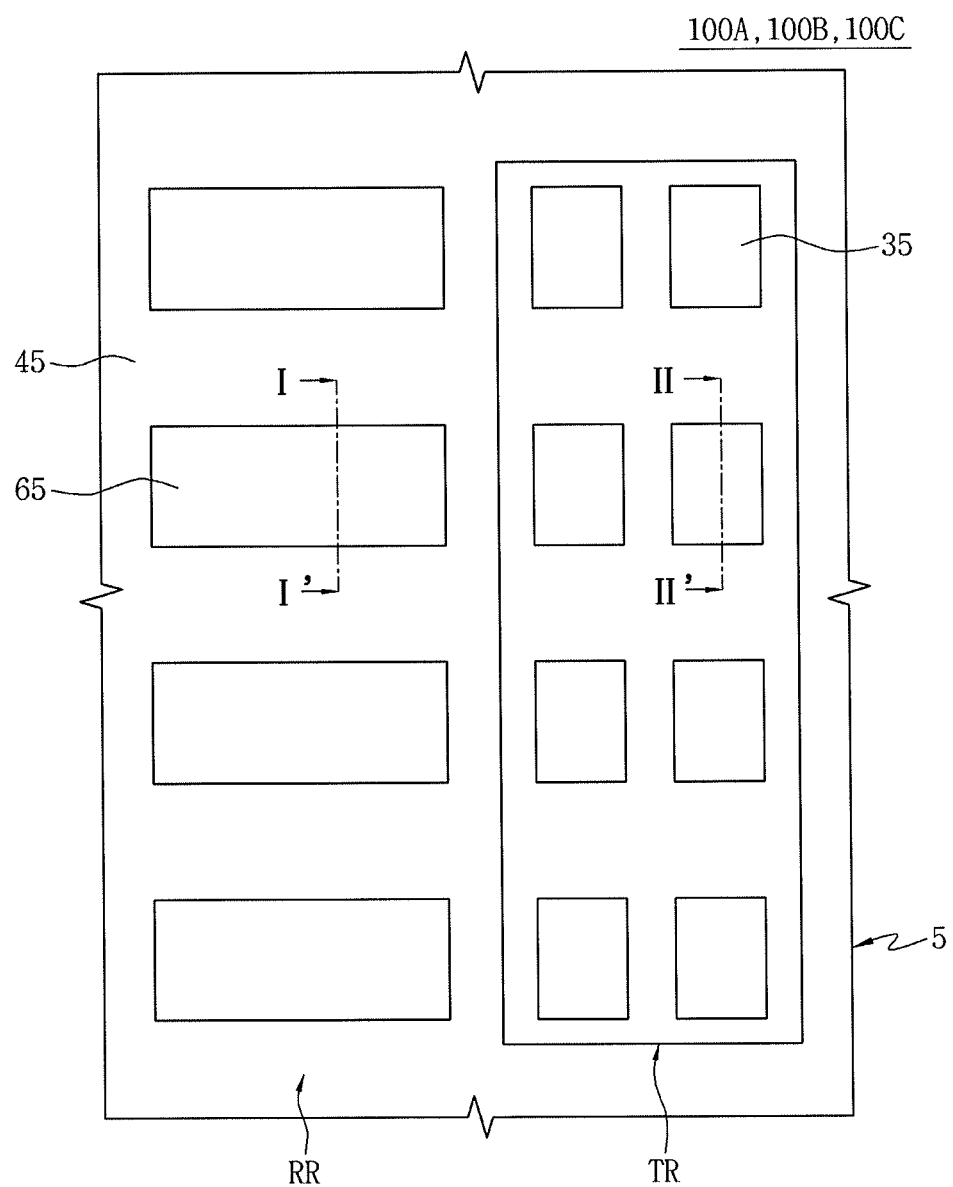
FIG. 1 illustrates a schematic plan view of a photomask in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Variations from the illustrated shapes, for example, as a result of manufacturing techniques and/or tolerances, are to be expected. Thus, embodiments should not be construed as limited to the particular shapes of regions illustrated herein but are to include deviations in shapes that result, for example, from manufacturing.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, or one or more intervening layers may also be present. In addition, it will also be understood that when a layer is referred to as being "between" two layers, it can be the only layer between the two layers, or one or more intervening layers may also be present. When an element or layer is referred to as being "directly on," "directly connected to" or "directly coupled to" another element or layer, there are no intervening elements or layers present. As used herein, the term "and/or" includes any and all combinations of one or more of the associated listed items. Like reference numerals refer to like elements throughout.

Additionally, it will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer and/or or section from another element, component, region, layer and/or or section. Thus, a first element, component, region, layer and/or or section discussed below could be termed a second element, component, region, layer and/or or section without departing from the teachings of the embodiment.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
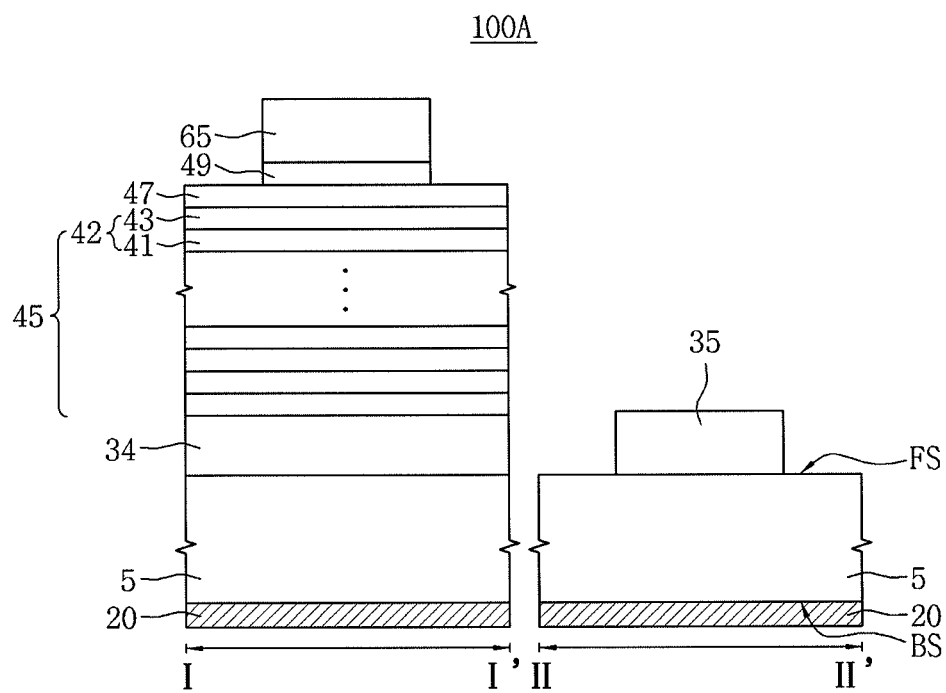
FIGS. 2A, 2B, and 2C illustrate cross-sectional views taken along lines I-I' and II-II' in FIG. 1.
Figure 2B:
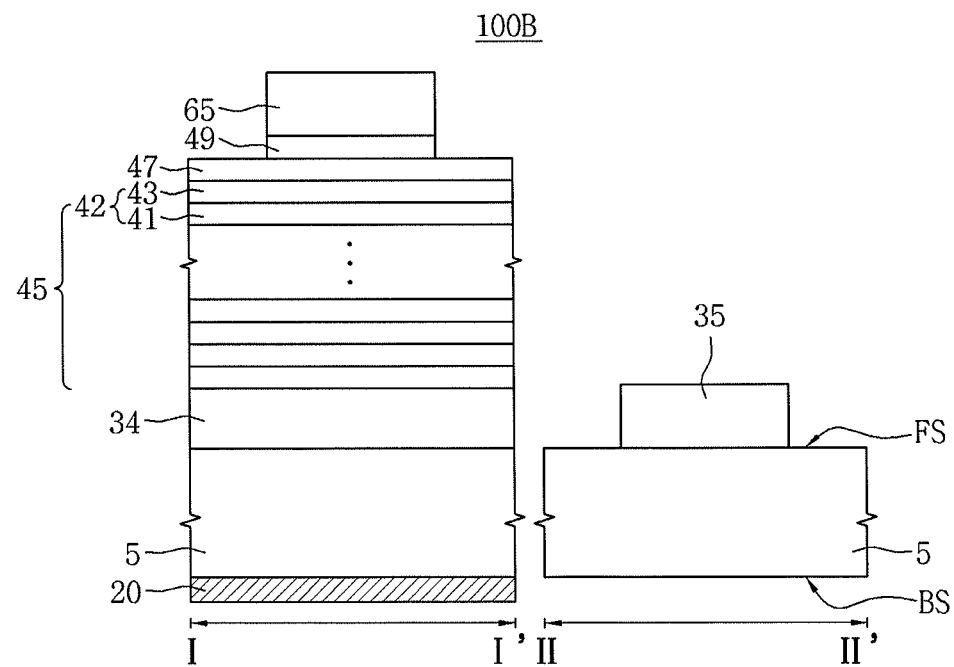
Figure 2C:
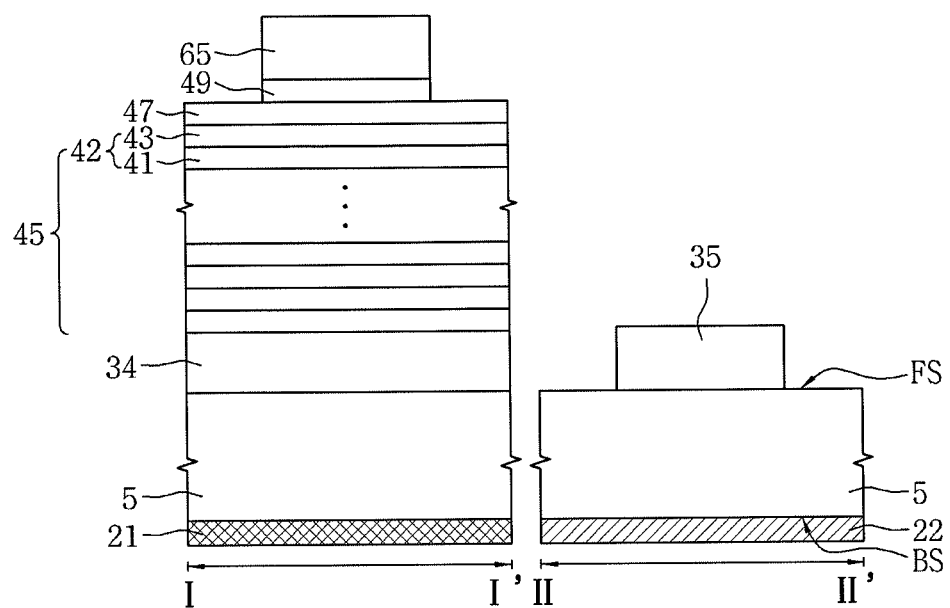

FIG. 1 illustrates a schematic plan view of a photomask in accordance with an embodiment, and FIGS. 2A, 2B, and 2C illustrate cross-sectional views taken along lines I-I' and II-II' in FIG. 1.

Referring to FIG. 1, photomasks 100A, 100B, and 100C in accordance with embodiments may include a reflective region RR and a transparent region TR arranged on a photomask substrate 5. The reflective region RR may surround and define the transparent region TR.

The reflective region RR may include a reflective layer 45 and absorbing patterns 65 formed on the reflective layer 45. The absorbing patterns 65 may selectively expose the reflective layer 45. The reflective layer 45 may reflect an EUV light, and the absorbing patterns 65 may not reflect but absorb the EUV light. Further details of the reflective layer 45 and absorbing patterns 65 will be described later.

The transparent region TR may include opaque patterns 35 formed on the photomask substrate 5. The opaque patterns 35 may selectively expose a surface of the photomask substrate 5. The opaque patterns 35 may absorb the EUV light. For example, the opaque patterns 35 may include the same material as the absorbing patterns 65. For example, the opaque patterns 35 and the absorbing patterns 65 may include chromium. Further details of the opaque patterns 35 will also be described later.

Referring to FIG. 2A, the photomask 100A in accordance with an embodiment may include a reflective region RR having an opaque layer 34, a reflective layer 45, and an absorbing pattern 65 which are formed on a front surface FS of the photomask substrate 5, and a transparent region TR having an opaque pattern 35 formed on the front surface FS of the photomask substrate 5.

The photomask substrate 5 may be transparent to both of a DUV light and the EUV light. For example, the photomask substrate 5 may include quartz, glass, or fused silica which may be doped with a low thermal expansion material such as titanium.

The opaque layer 34 may include a metal such as chromium or tantalum nitride (TaN).

The reflective layer 45 may include a stack of unit reflective material layers 42. Each of the unit reflective material layers 42 may include a first reflective material layer 41 and a second reflective material layer 43. Each of the unit reflective material layers 42, and the first and second reflective material layers 41 and 43, may have a suitable thickness. For example, each of the first and second reflective material layers 41 and 43 may have a thickness within a 20 percent deviation from multiples of a quarter of a wavelength of the EUV light. Each of the unit reflective material layers 42 may have a thickness within a 10 percent deviation from multiples of half of a wavelength of the EUV light. For example, if the wavelength (λ) of the EUV light is about 13.5 nm, the thickness of the unit reflective material layer 42 may be about 6.075 to about 7.425 nm. For example, the first reflective material layer 41 may be formed of 15 atomic layers of silicon to have a thickness of about 4.1 nm, and the second reflective material layer 43 may be formed of 11 atomic layers of molybdenum to have a thickness of about 2.7 nm. Accordingly, in an embodiment, the unit reflective material layer 42 may be formed to have a thickness of about 6.8 nm, the first reflective material layer 41 may be formed to have a thickness of about 4.1 nm, and the second reflective material layer 43 may be formed to have a thickness of about 2.7 nm.

The reflective layer 45 may include a stack of a suitable number of unit reflective material layers 42, e.g., about forty unit reflective material layers 42. The thickness of the reflective layer 45 may be a suitable thickness, e.g., the thickness of the reflective layer 45 may be about 270 nm. The unit reflective material layers 42 may be stacked at more or less than forty layers. Even when more than fifty unit reflective material layers 42 are stacked, defects may not occur. When fifty unit reflective material layers 42 are stacked, a total thickness of the reflective layer 45 may be about 340 nm. A sidewall of the reflective layer 45 may be formed at an angle greater than 75 degrees, and preferably greater than 85 degrees. To easily understand the embodiments, the sidewall of the reflective layer 45 is illustrated in the drawings as being perpendicular to the surface of the photomask substrate 5. The first reflective material layer 41 may include, e.g., silicon. The second reflective material layer 43 may include, e.g., molybdenum or ruthenium.

A capping layer 47 may be formed on a top of the reflective layer 45. The capping layer 47 may fully cover the reflective layer 45. The capping layer 47 may include, e.g., silicon or silicon oxide. The capping layer 47 may protect the reflective layer 45 from physical or chemical damage. The capping layer 47 may be formed to have a thickness less than a wavelength of a light. When the capping layer 47 is formed to have a thickness less than a wavelength of the EUV light, the wavelength of the EUV light may not be affected by the capping layer 47. For example, the capping layer 47 may be formed to have a thickness of about 11 nm. In another example embodiment, the capping layer 47 may be formed of ruthenium to be thin, with a thickness of about 3 nm.

The photomask 100A may further include a buffer pattern 49 formed between the reflective layer 45 and the absorbing pattern 65. The buffer pattern 49 may have the same pattern design as the absorbing pattern 65. That is, sides of the buffer pattern 49 may be vertically aligned with sides of the absorbing pattern 65. The buffer pattern 49 may enhance adhesion between the reflective layer 45 and the absorbing pattern 65. The buffer pattern 49 may include, e.g., silicon oxide or chromium nitride. In an embodiment, when both of the capping layer 47 and the absorbing pattern 65 include metals, the buffer pattern 49 may be omitted.

The opaque pattern 35 may include a metal such as chromium or tantalum nitride. In an embodiment, chromium oxide may be further formed on a surface of the opaque pattern 35. The opaque pattern 35 may include the same material as the opaque layer 34. The opaque pattern 35 and the opaque layer 34 may have the same vertical thickness (i.e., thickness in a direction perpendicular to the surface of the photomask substrate).

The photomask substrate 5 may be transparent to the DUV light. Both of the absorbing pattern 65 and the opaque pattern 35 may be opaque to the EUV light and the DUV light. The absorbing pattern 65 and the opaque pattern 35 may absorb the EUV light. The reflective layer 45 may reflect the EUV light.

In an embodiment, the photomask 100A may include a conductive layer 20 on a back surface BS of the photomask substrate 5. The conductive layer 20 may include, e.g., a metal or a metal composite. For example, the conductive layer 20 may include Cr, Al, Mo, Ni, Ti, TiN, ZrO, silver wires, conductive polymers, or indium tin oxide (ITO). The conductive layer 20 may be substantially transparent to the DUV light. For example, the conductive layer 20 may be formed of a transparent substance or formed thin enough to be substantially transparent.

Referring to FIG. 2B, in accordance with an embodiment, the conductive layer 20 may be omitted on a back surface BS corresponding to the transparent region TR of the photomask substrate 5 in the photomask 100B, (i.e., when compared to the conductive layer 20 in the photomask 100A described in FIG. 2A). That is, the back surface BS of the photomask substrate 5 corresponding to the transparent region TR may be exposed.

Referring to FIG. 2C, in accordance with an embodiment, the photomask 100C may include an opaque conductive layer 21 formed on a back surface BS corresponding to the reflective region RR of the photomask substrate 5, and a transparent conductive layer 22 formed on the back surface corresponding to the transparent region TR (i.e., when compared to the photomasks 100A and 100B respectively described in FIGS. 2A and 2B). Each of the opaque and transparent conductive layers 21 and 22 may include Cr, Al, Mo, Ni, Ti, TiN, ZrO, silver wires, conductive polymers, or ITO. For example, the opaque conductive layer 21 may be formed relatively thick, and the transparent conductive layer 22 may be formed relatively thin. In addition, the opaque conductive layer 21 and the transparent conductive layer 22 may include different materials from each other.

Figure 3:
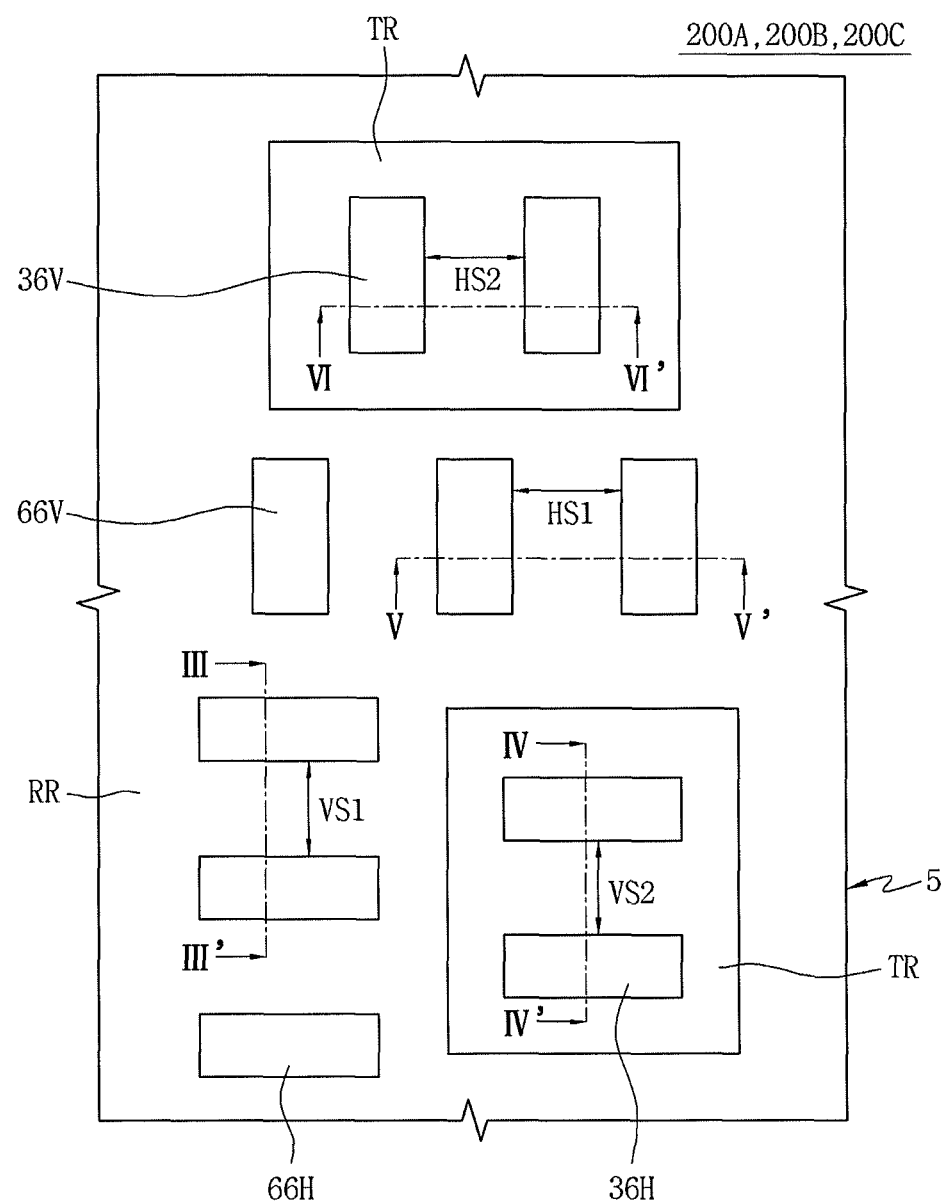
FIG. 3 illustrates a schematic plan view of a photomask in accordance with an embodiment.
Figure 4A:
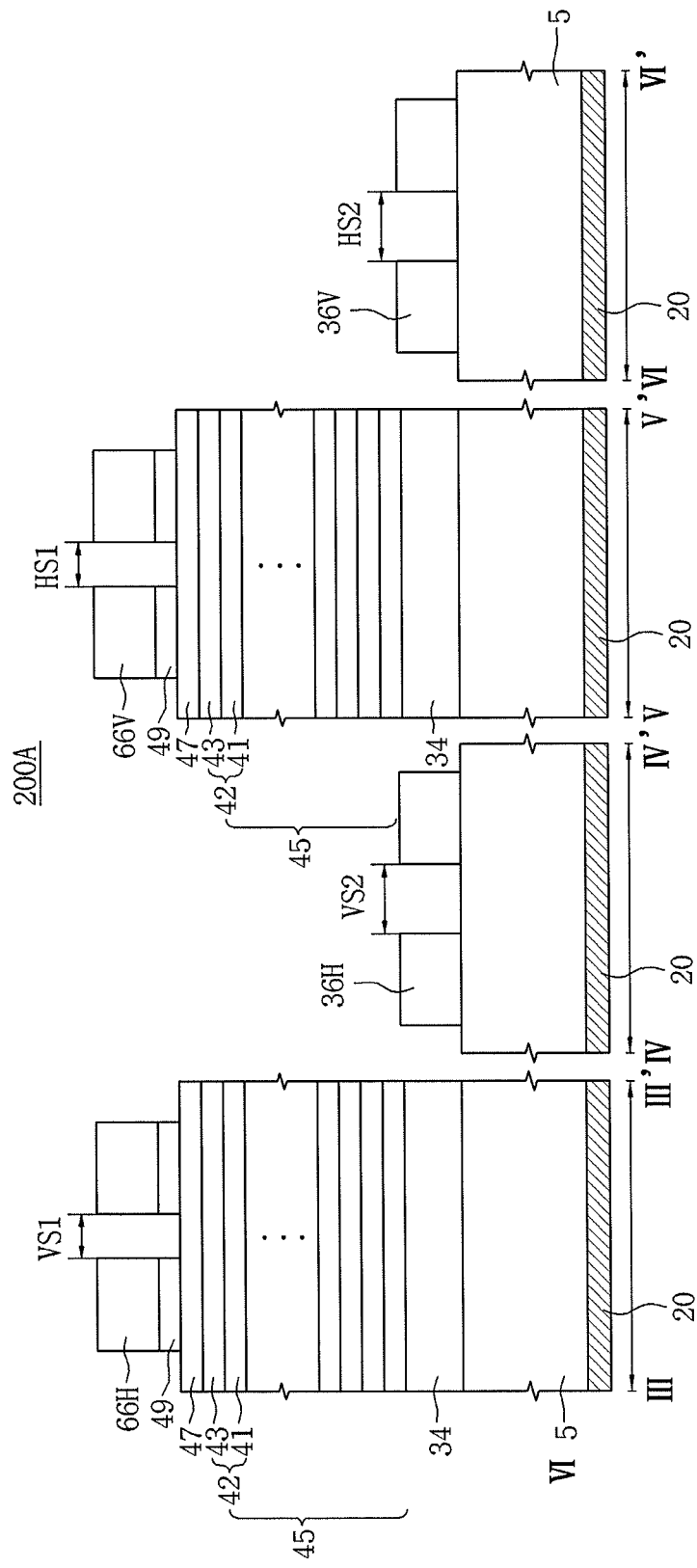
FIGS. 4A, 4B, and 4C illustrate cross-sectional views taken along lines IV-IV', V-V', and VI-VI' in FIG. 3.
Figure 4B:
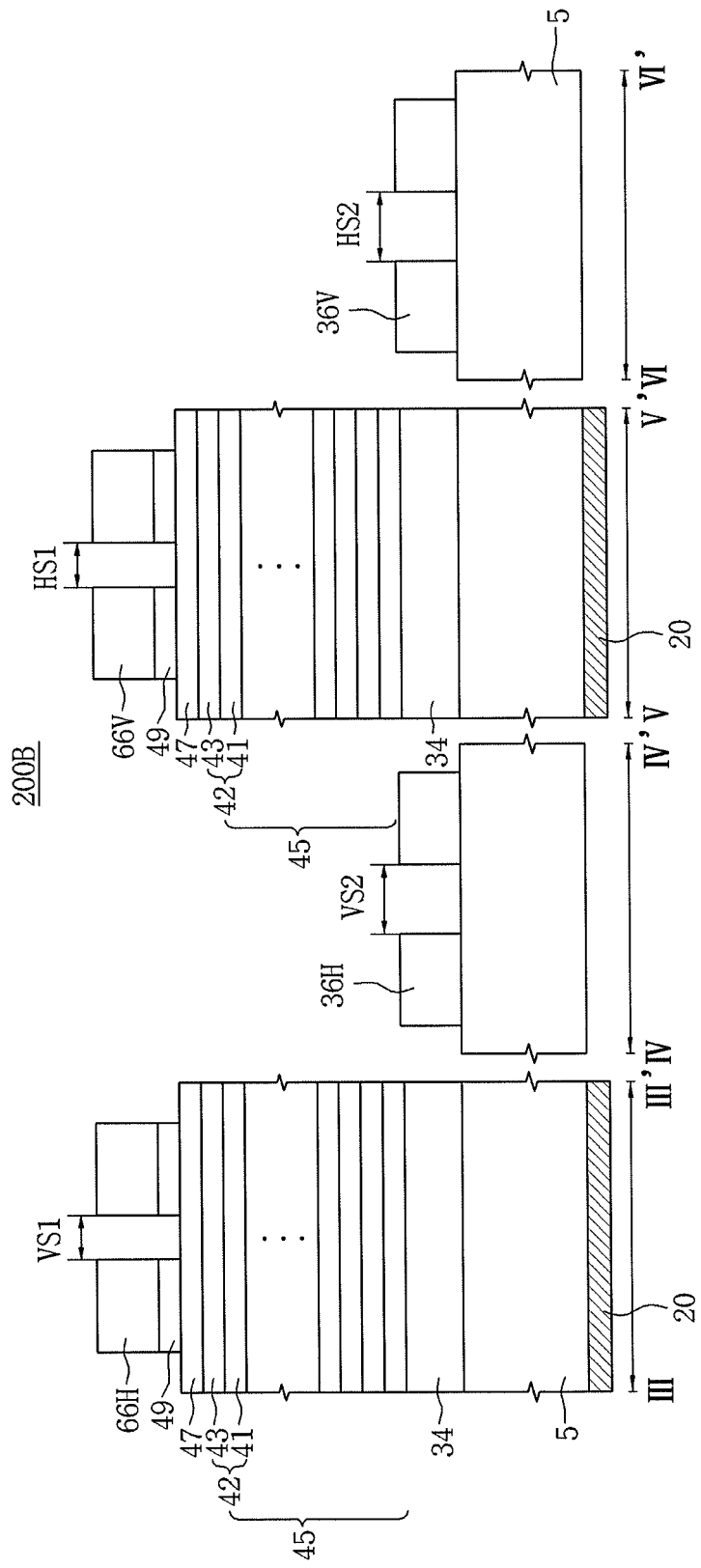
Figure 4C:
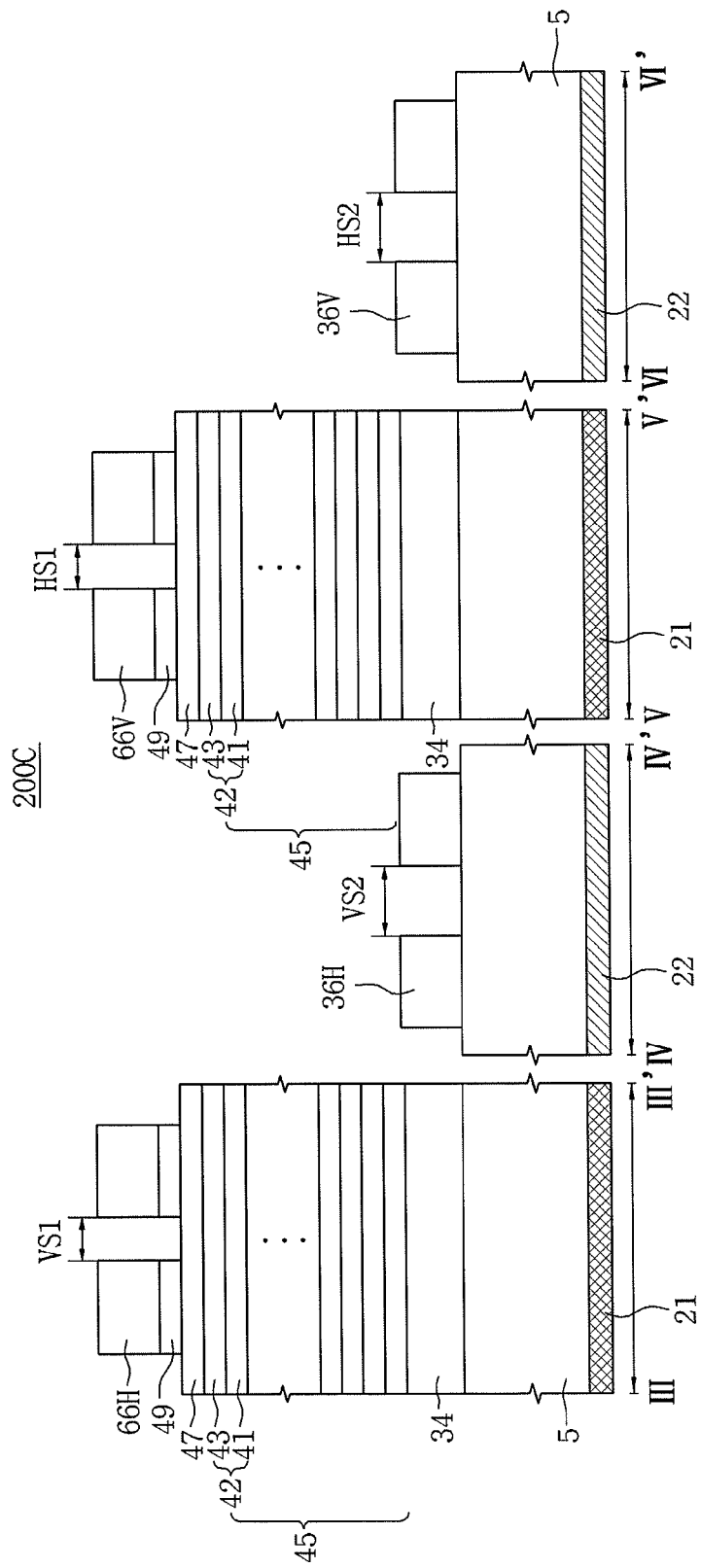

FIG. 3 illustrates a schematic plan view of a photomask in accordance with an embodiment, and FIGS. 4A, 4B, and 4C illustrate cross-sectional views taken along lines IV-IV', V-V', and VI-VI' in FIG. 3. In FIGS. 3, 4A, 4B, and 4C, various elements may be similar to the elements described above, and a detailed description thereof will not be repeated.

Referring to FIG. 3, photomasks 200A, 200B, and 200C in accordance with an embodiment may include a plurality of parallel horizontal absorbing patterns 66H and parallel vertical absorbing patterns 66V disposed in a reflective region RR, and a plurality of parallel horizontal opaque patterns 36H and parallel vertical opaque patterns 36V disposed in a transparent region TR. The horizontal absorbing patterns 66H may be spaced apart from each other by a first vertical spacing VS1. The horizontal opaque patterns 36H may be spaced apart from each other by a second vertical spacing VS2. The vertical absorbing patterns 66V may be spaced apart from each other by a first horizontal spacing HS1. The vertical opaque patterns 36V may be spaced apart from each other by a second horizontal spacing HS2. For example, the first vertical spacing VS1 may be narrower than the second vertical spacing VS2, or the first vertical spacing VS1 may be the same as the second vertical spacing VS2. The first horizontal spacing HS1 may be narrower than the second horizontal spacing HS2, or the first horizontal spacing HS1 may be the same as the second horizontal spacing HS2. The first vertical spacing VS1 and the second vertical spacing VS2, and the first horizontal spacing HS1 and the second horizontal spacing HS2, may be used for correcting or compensating alignment, overlay, etc. between a photolithography system using an EUV light and a photolithography system using a DUV light.

Referring to FIG. 4A, the photomask 200A in accordance with an embodiment may include an opaque layer 34, a reflection layer 45, horizontal absorbing patterns 66H, and vertical absorbing patterns 66V formed on a front surface FS of the photomask substrate 5 corresponding to the reflection region RR, and may include horizontal opaque patterns 36H and vertical opaque patterns 36V formed on the front surface FS of the photomask substrate 5 corresponding to the transparent region TR. As mentioned above, the horizontal absorbing patterns 66H may be spaced apart from each other by the first vertical spacing VS1, and the horizontal opaque patterns 36H may be spaced apart from each other by the second vertical spacing VS2. The vertical absorbing patterns 66V may be spaced apart from each other by the first horizontal spacing HS1, and the vertical opaque patterns 36V may be spaced apart from each other by the second horizontal spacing HS2. In addition, as mentioned above, the first horizontal spacing HS1 may be different from the second horizontal spacing HS2, and the first vertical spacing VS1 may be different from the second vertical spacing VS2.

Referring to FIG. 4B, in accordance with an embodiment, in the photomask 200B, the conductive layer 20 on a back surface BS corresponding to the transparent region TR of the photomask substrate 5 may be omitted (i.e., when compared to the conductive layer 20 in the photomask 200A described in FIG. 4A). That is, the back surface BS of the photomask substrate 5 corresponding to the transparent region TR may be exposed.

Referring to FIG. 4C, in accordance with an embodiment, the photomask 200C may include an opaque conductive layer 21 formed on a back surface BS corresponding to the reflective region RR of the photomask substrate 5, and a transparent conductive layer 22 formed on the back surface BS corresponding to the transparent region TR (i.e., when compared to the photomasks 200A and 200B respectively described in FIGS. 4A and 4B).

The photomasks 100A to 100C and 200A to 200C, in accordance with various embodiments, may be used in both photolithography systems using the EUV light and the DUV light. Specifically, by using one or more of the photomasks 100A to 100C and 200A to 200C, an optical pattern or a material pattern may be formed on the same wafer by performing a first photolithography process in a photolithography system using the EUV light, followed by a second photolithography process in a photolithography system using the DUV light. Conversely, an optical pattern or a material pattern may be formed on the same wafer by performing a first photolithography process in a photolithography system using the DUV light, followed by a second photolithography process in the photolithography system using the EUV light. That is, an optical pattern or a material pattern may be formed using the same photomask on the same wafer by performing two photolithography processes in two respective photolithography systems. The optical pattern or material pattern may be simultaneously formed by the photolithography system using the EUV light and by the photolithography system using the DUV light. The optical pattern or a material pattern may be used for correcting or compensating alignment, overlay, etc. between the photolithography system using the EUV light and the photolithography system using the DUV light.

Figure 5:
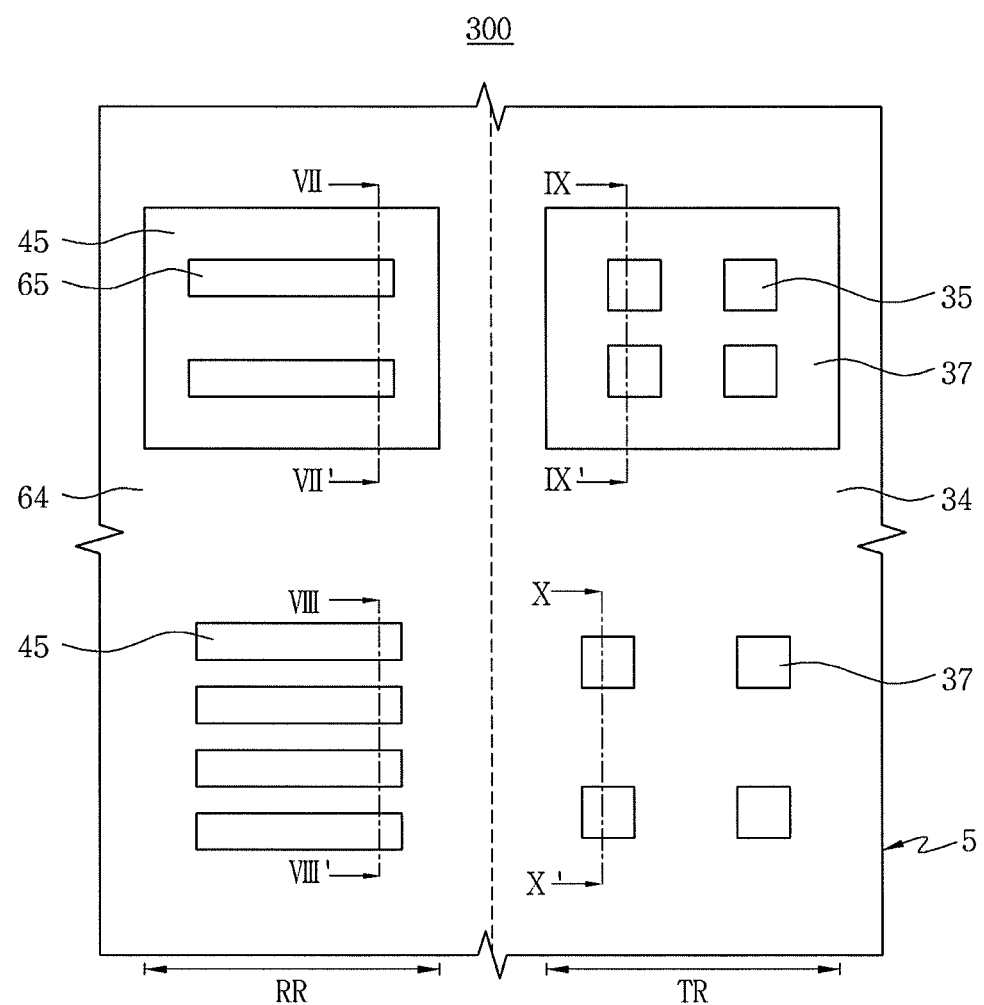
FIG. 5 illustrates a schematic plan view of a photomask in accordance with an embodiment.

FIG. 5 illustrates a schematic plan view of a photomask in accordance with an embodiment, and FIGS. 6A, 6B, 6C, and 6D are cross-sectional views taken along lines VII-VII', VIII-VIII', IX-IX' and X-X' in FIG. 5. In FIGS. 5, 6A, 6B, 6C, and 6D, various elements may be similar to the elements described above, and a detailed description thereof will not be repeated.

Referring to FIG. 5, a photomask 300 in accordance with an embodiment may include a reflective region RR and a transparent region TR. The reflective region RR may include a reflective layer 45 formed on a photomask substrate 5, and an absorbing layer 64 and absorbing patterns 65 formed on the reflective layer 45. The transparent region TR may include an opaque layer 34 and opaque patterns 35 formed on the photomask substrate 5. The transparent regions TR may include a transparent pattern 37 defined by the opaque layer 34.

Figure 6A:
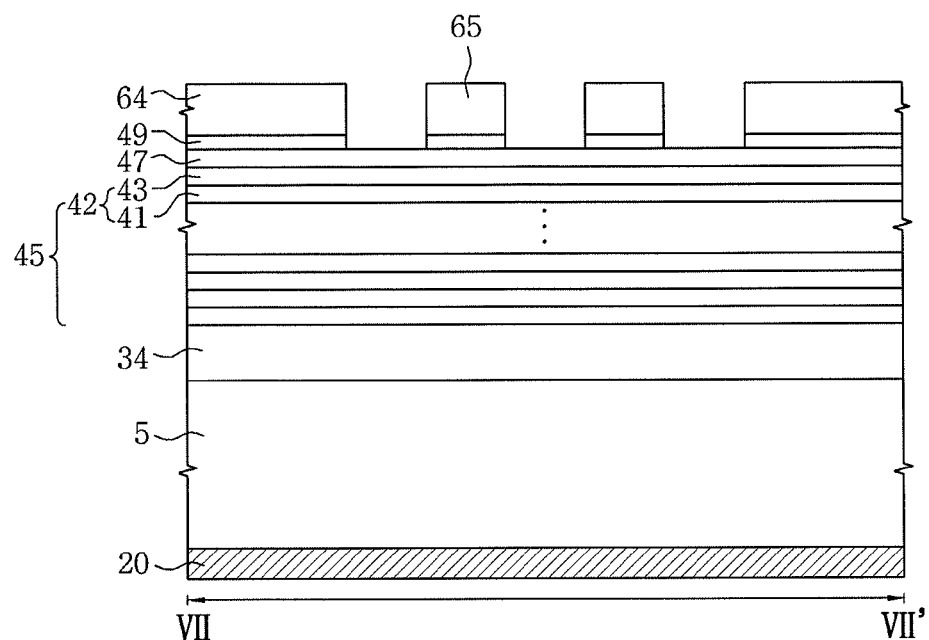
FIGS. 6A, 6B, 6C, and 6D illustrate cross-sectional views taken along lines VII-VII', VIII-VIII', IX-IX' and X-X' in FIG. 5.
Figure 6B:
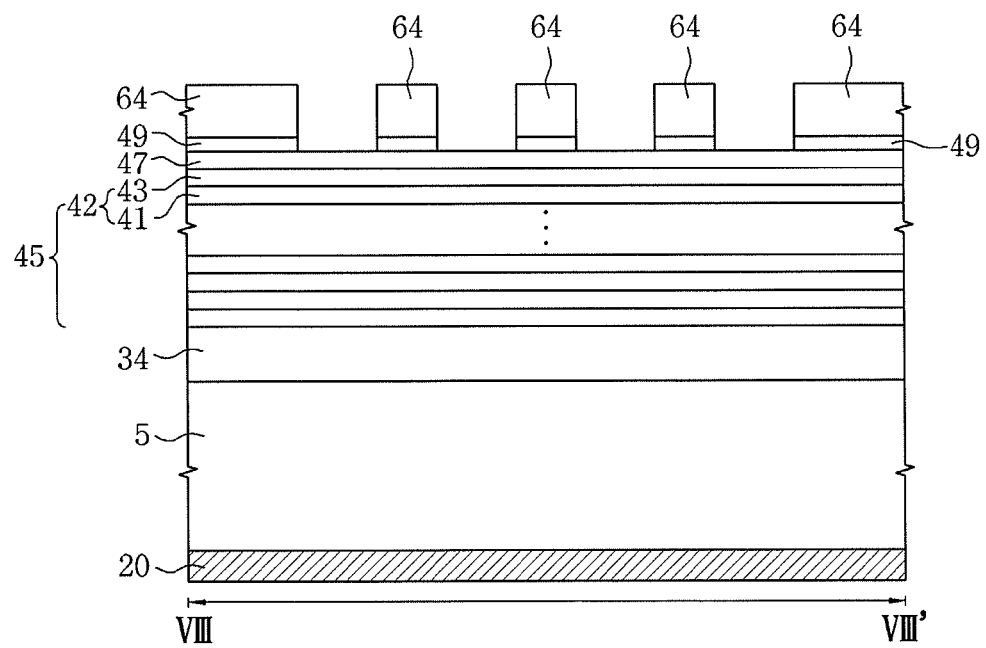

Referring to FIGS. 6A and 6B, the reflective region RR of the photomask 300 in accordance with an embodiment may include the reflective layer 45 formed on the photomask substrate 5, and the absorbing layer 64 and absorbing patterns 65 formed on the reflective layer 45. For example, a portion of the reflective layer 45 may be defined and exposed by the absorbing layer 64 and the absorbing patterns 65.

Figure 6C:
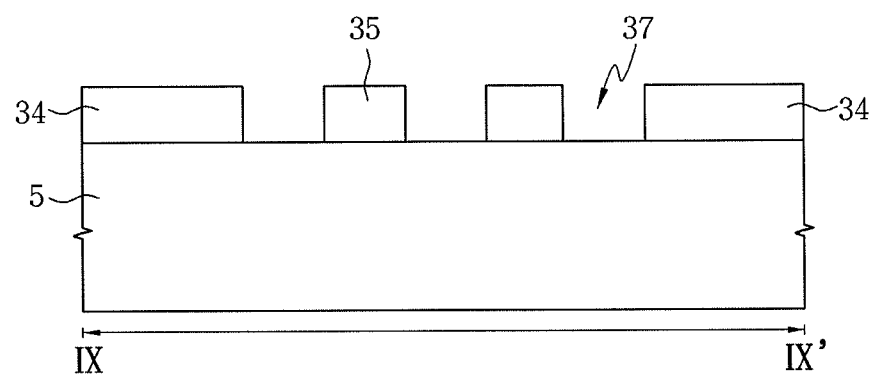
Figure 6D:
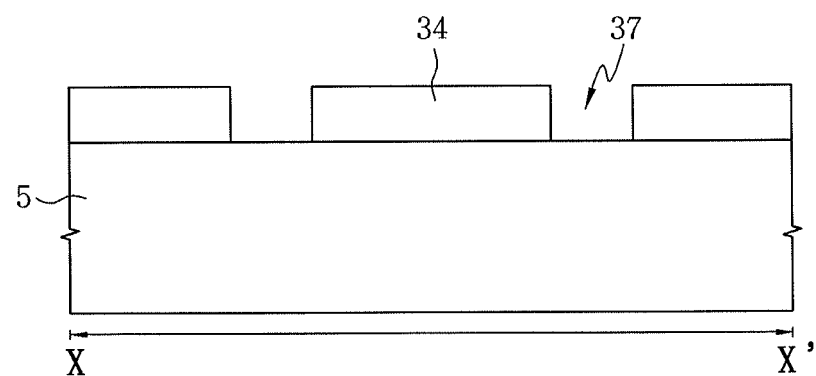

Referring to FIGS. 6C and 6D, the transparent region TR of the photomask 300 in accordance with an embodiment may include the opaque layer 34 and opaque patterns 35 formed on the photomask substrate 5. For example, a portion of the photomask substrate 5 may be defined and exposed by the opaque layer 34 and opaque patterns 35 (i.e., such that the exposed portion of the photomask substrate 5 is the transparent pattern 37).

Figure 7A:
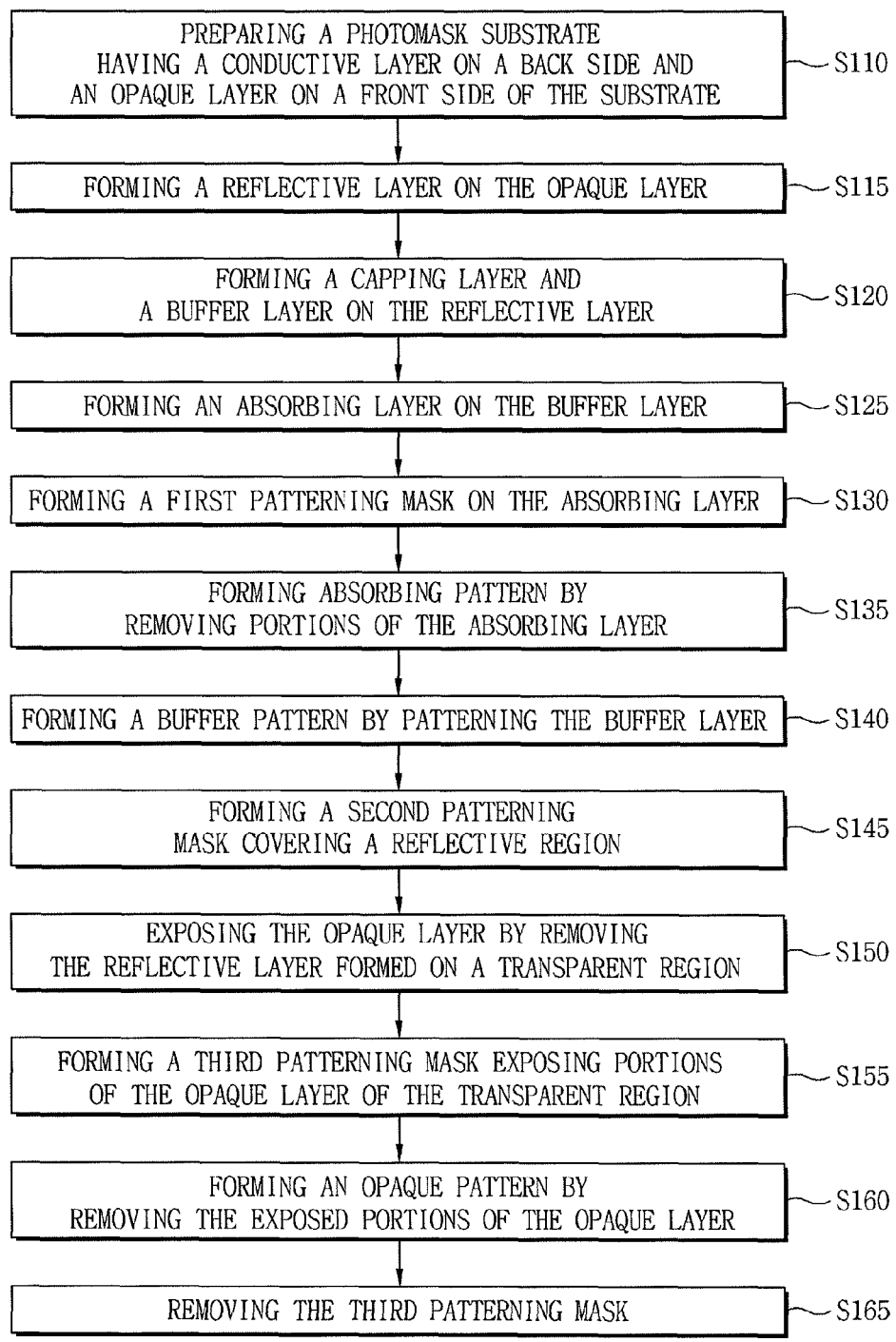
FIGS. 7A, 7B, and 7C illustrate flowcharts of methods of fabricating photomasks in accordance with embodiments.
Figure 7B:
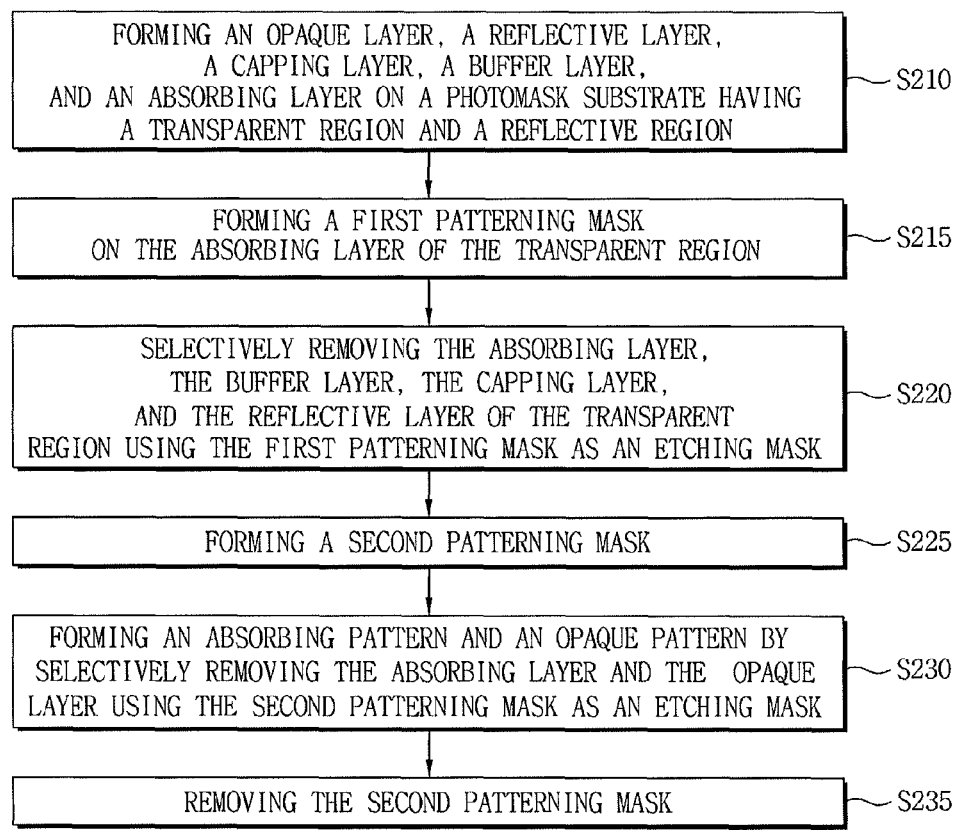
Figure 7C:
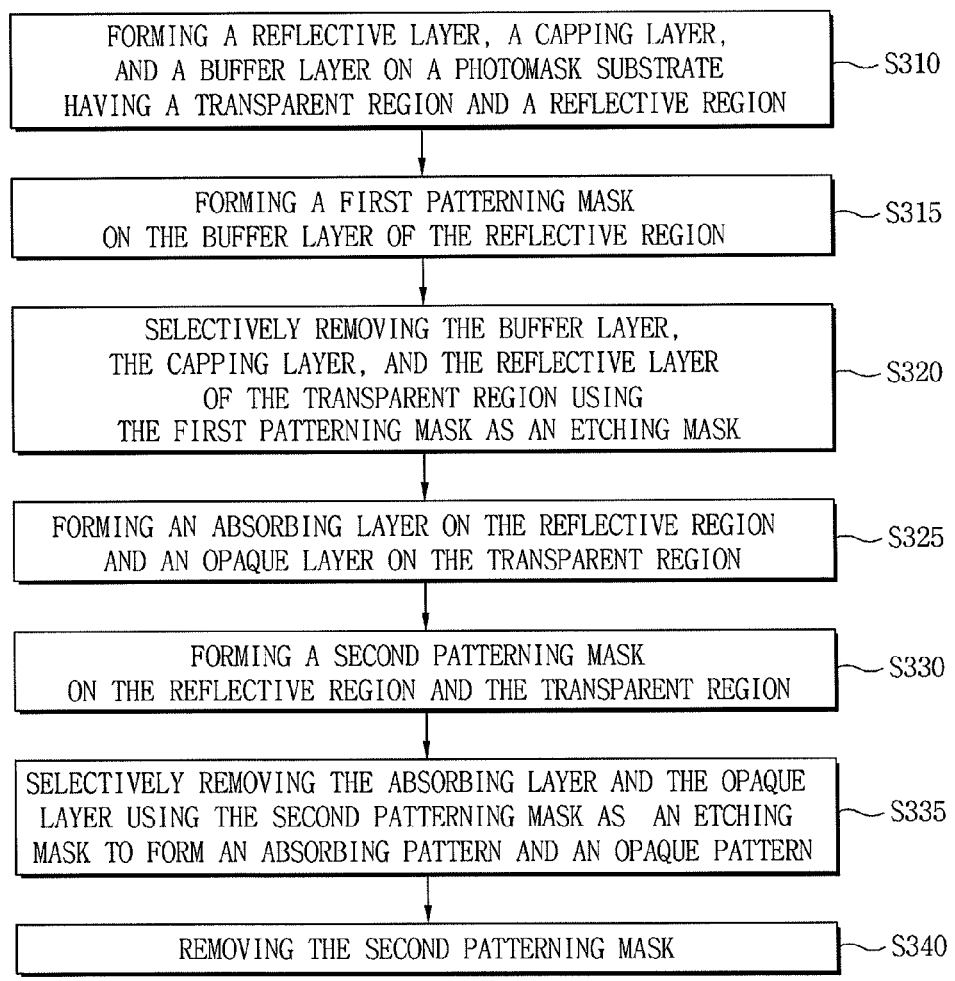

FIGS. 7A, 7B, and 7C illustrate flowcharts of methods of fabricating photomasks in accordance with embodiments.

FIGS. 8A, 8B, 8C, 8D, 8E, 8F, 8G, 8H, 8I, 8J, 9A, 9B, 9C, 9D, 10A, 10B, 10C, 10D, 10E, and 10F illustrate cross-sectional showing stages in the fabrication of photomasks in accordance with embodiments.

Figure 8A:
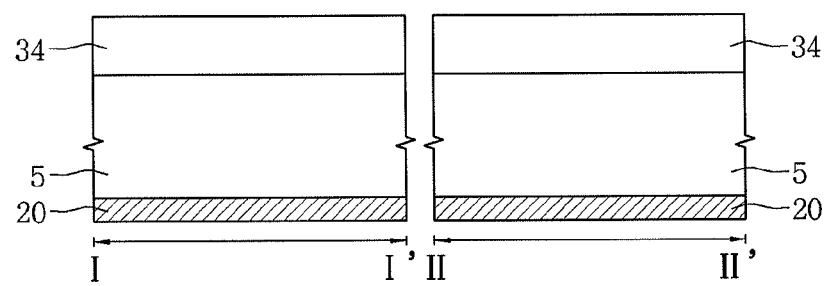
FIGS. 8A, 8B, 8C, 8D, 8E, 8F, 8G, 8H, 8I, 8J, 9A, 9B, 9C, 9D, 10A, 10B, 10C, 10D, 10E, and 10F illustrate cross-sectional views showing stages in the fabrication of photomasks in accordance with embodiments.

Referring to FIGS. 7A and 8A, a fabrication method of a photomask in accordance with an embodiment may include preparing a photomask substrate 5 which has a conductive layer 20 directly formed on a back surface BS and an opaque layer 34 directly formed on a front surface FS (S110). The photomask substrate 5 may include, e.g., quartz, glass, or fused silica which is doped with a low thermal expansion material such as titanium. The conductive layer 20 may include, e.g., one of Cr, Al, Mo, Ni, Ti, TiN, ZrO, silver wires, conductive polymers, and ITO. The conductive layer 20 may be formed by a suitable method, for example, pasting, coating, CVD, or PVD such as sputtering, according to the material of the conductive layer 20. For example, when the conductive layer 20 includes a metal, the conductive layer 20 may be formed by a PVD method such as sputtering. When the conductive layer 20 includes a composite such as an oxide or a nitride, the conductive layer 20 may be formed by a PVD or CVD method. Or, when the conductive layer 20 includes silver wires or conductive polymers, the conductive layer 20 may be formed by a pasting or coating method. The opaque layer 34 may be formed by, e.g., a CVD or PVD method. For example, the opaque layer 34 may include, e.g., Cr, TaN, or TiN. The opaque layer 34 may absorb the EUV light and reflect the DUV light.

Figure 8B:
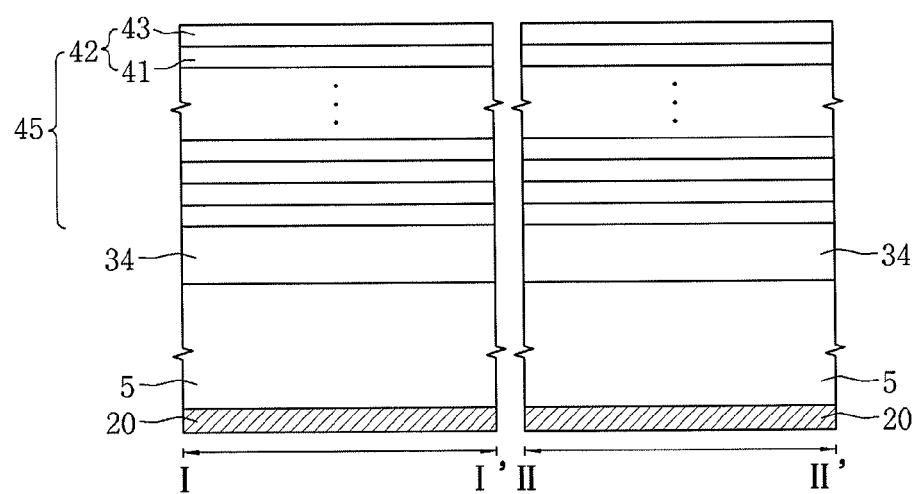

Referring to FIGS. 7A and 8B, a fabrication method of a photomask in accordance with an embodiment may include forming a reflective layer 45 on the opaque layer 34 (S115). The formation of the reflective layer 45 may include forming a stack of unit reflective material layers 42, wherein the unit reflective material layer 42 has a first reflective material layer 41, and a second reflective material layer 43. The first reflective material layer 41 may include, e.g., silicon. The second reflective material layer 43 may include, e.g., molybdenum or ruthenium. The unit reflective material layer 42 may be formed using, e.g., ion beam sputtering deposition technology.

Figure 8C:
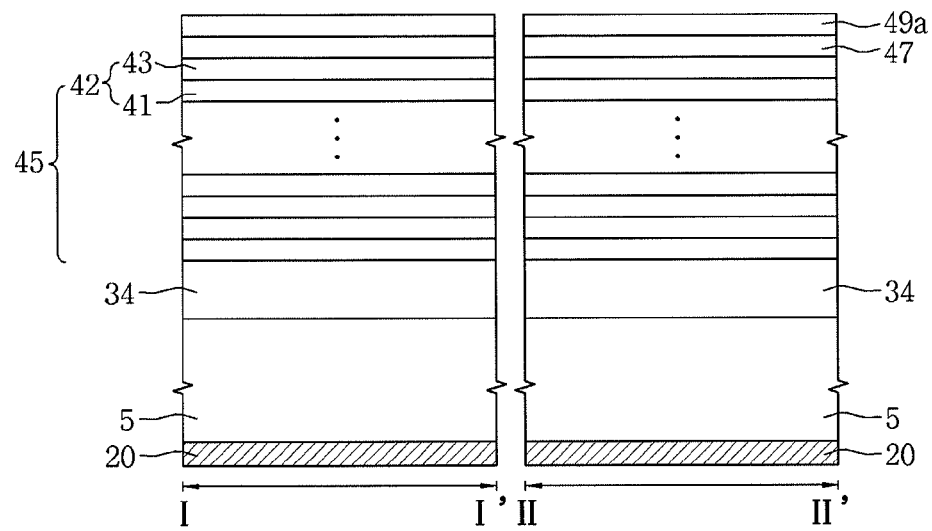

Referring to FIGS. 7A and 8C, a fabrication method of a photomask in accordance with an embodiment may include forming a capping layer 47 and a buffer layer 49*a* on the reflective layer 45 (S120). The capping layer 47 may be formed by, e.g., a CVD or PVD method. The capping layer 47 may be formed of silicon, ruthenium, and/or a combination (e.g., lamination) thereof. The buffer layer 49*a* may protect the capping layer 47 and/or the reflective layer 45 from etching damage. The buffer layer 49*a* may be formed by, e.g., a CVD or PVD method. The buffer layer 49*a* may include, e.g., $SiO_2$, $Al_2O_3$, Cr, or CrN.

Figure 8D:
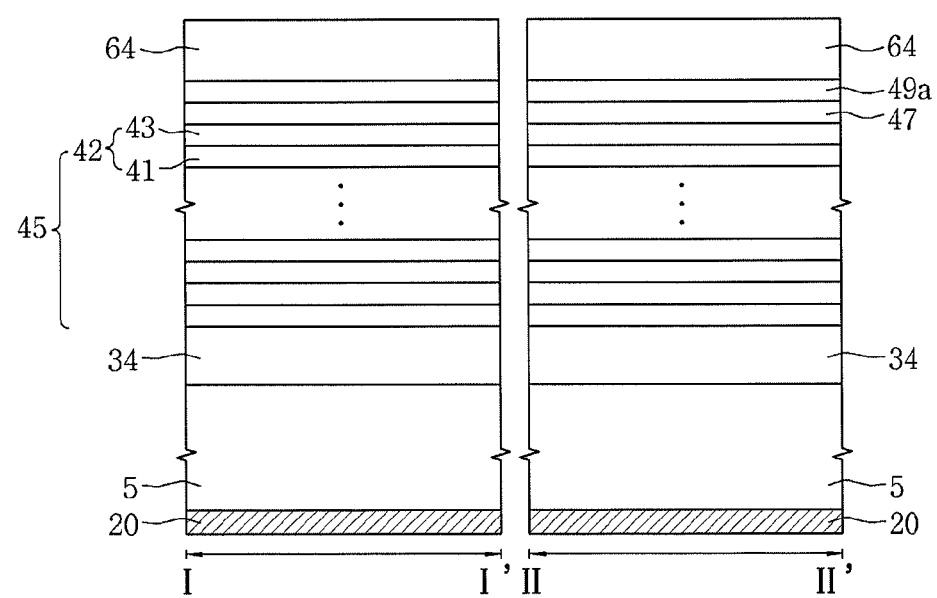

Referring to FIGS. 7A and 8D, a fabrication method of a photomask in accordance with an embodiment may include forming an absorbing layer 64 on the buffer layer 49*a* (S125). The absorbing layer 64 may be formed by, e.g., a CVD or PVD method. The absorbing layer 64 may include the same material as the opaque layer 34.

Figure 8E:
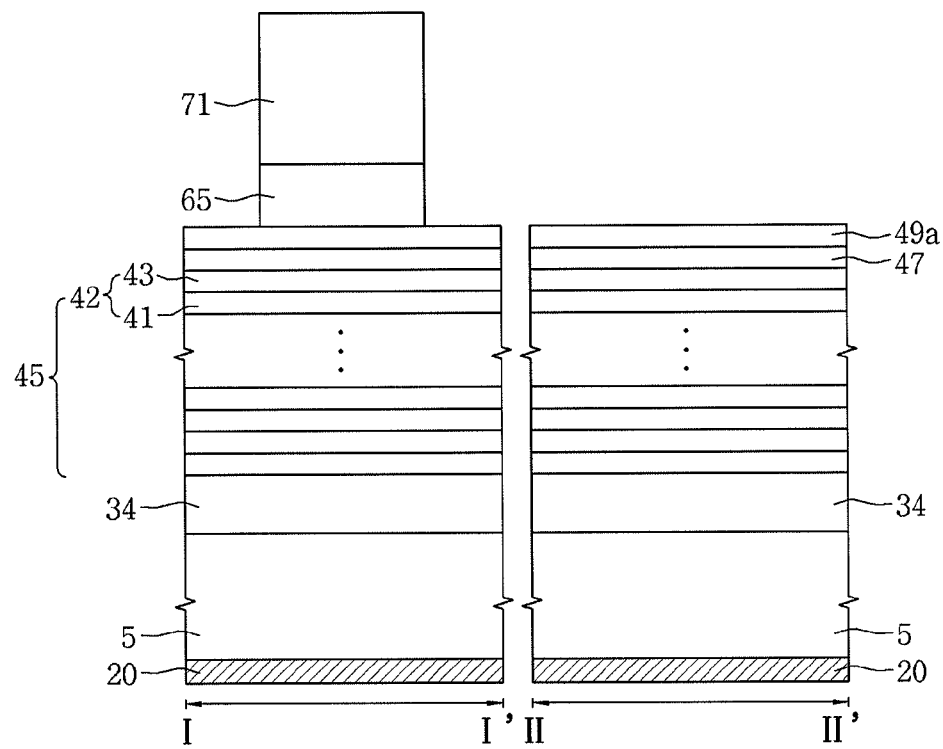

Referring to FIGS. 7A and 8E, a fabrication method of a photomask in accordance with an embodiment may include forming a first patterning mask 71 on the absorbing layer 64 (S130) and forming an absorbing pattern 65 by removing some portions of the absorbing layer 64 using the first patterning mask 71 as an etching mask (S135). For example, the first patterning mask 71 may be formed by forming an electron beam resist film on the entire absorbing layer 64, irradiating an electron beam on the electron beam resist film, and developing the electron beam resist film. For example, the first patterning mask 71 may be formed only in the reflective region RR. In the process S130, the absorbing layer 64 formed in the transparent region TR may be fully removed. Then, the first patterning mask 71 may be removed.

Figure 8F:
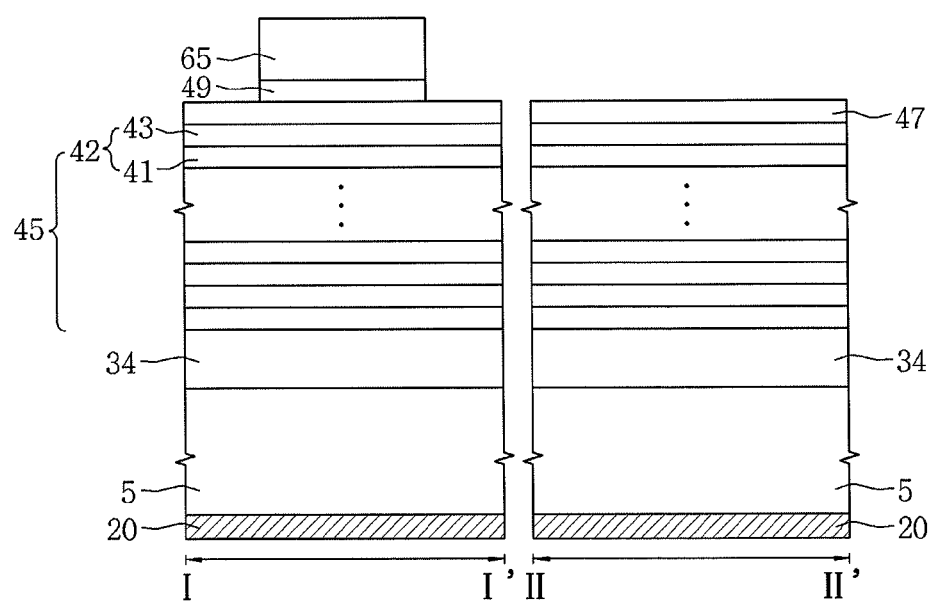

Referring to FIGS. 7A and 8F, a fabrication method of a photomask in accordance with an embodiment may include patterning the buffer layer 49*a* to form a buffer pattern 49 using the absorbing pattern 65 as an etching mask (S140). The buffer layer 49*a* formed in the transparent region TR may be fully removed. In addition, the buffer layer 49*a* and the absorbing layer 64 may be etched at the same time using the first patterning mask 71 as an etching mask.

Figure 8G:
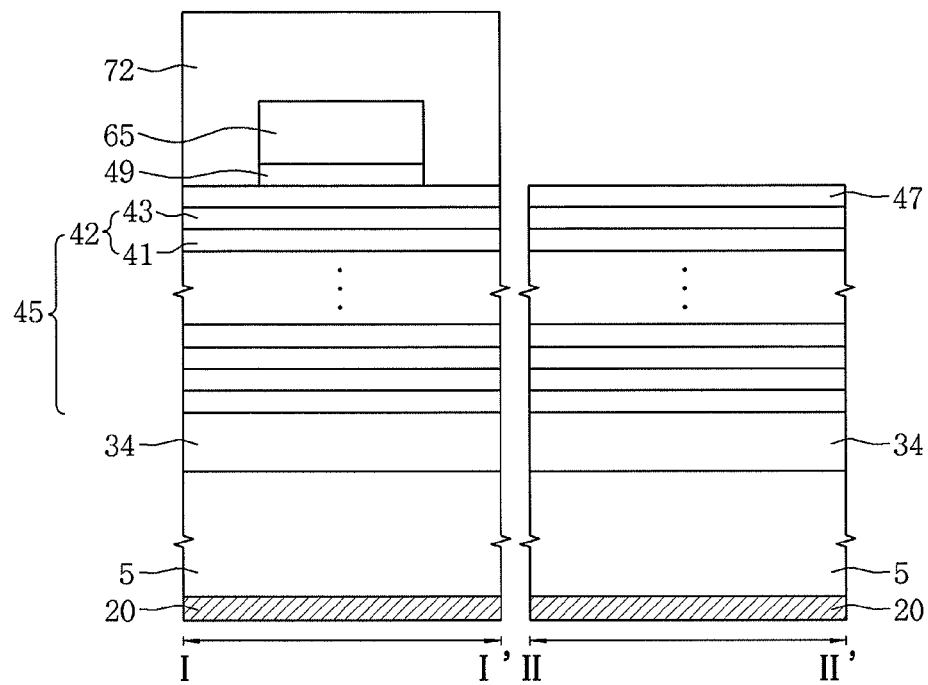

Referring to FIGS. 7A and 8G, a fabrication method of a photomask in accordance with an embodiment may include a second patterning mask 72 covering the reflective region RR (S145). The second patterning mask 72 may include, e.g., an electron beam resist or a photo resist.

Figure 8H:
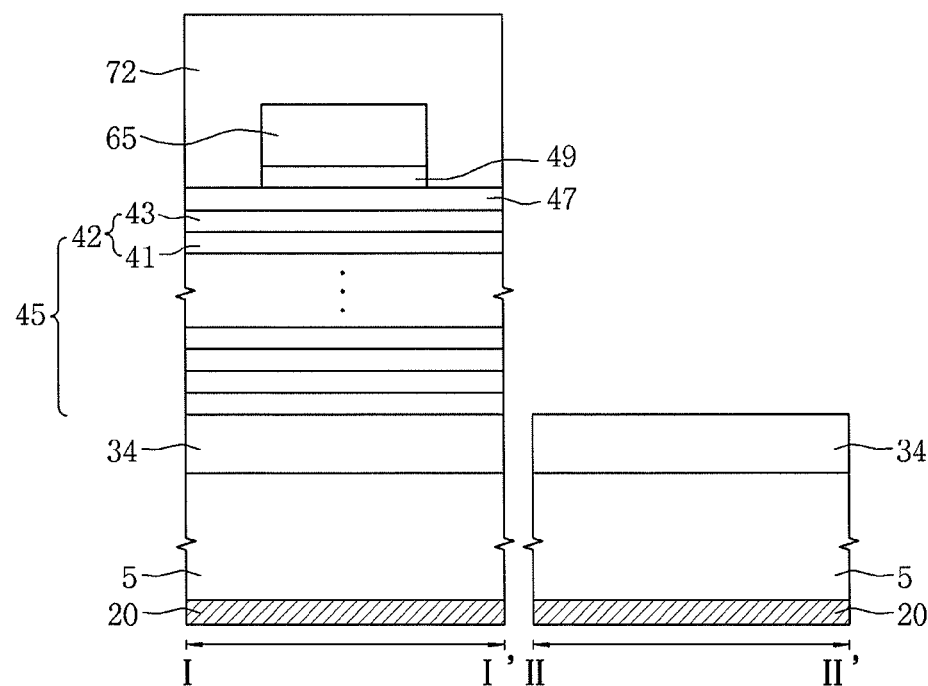

Referring to FIGS. 7A and 8H, a fabrication method of a photomask in accordance with an embodiment may include removing the reflective layer 45 formed in the transparent region TR to expose an opaque layer 34. Then, the second patterning mask may be removed.

Figure 8I:
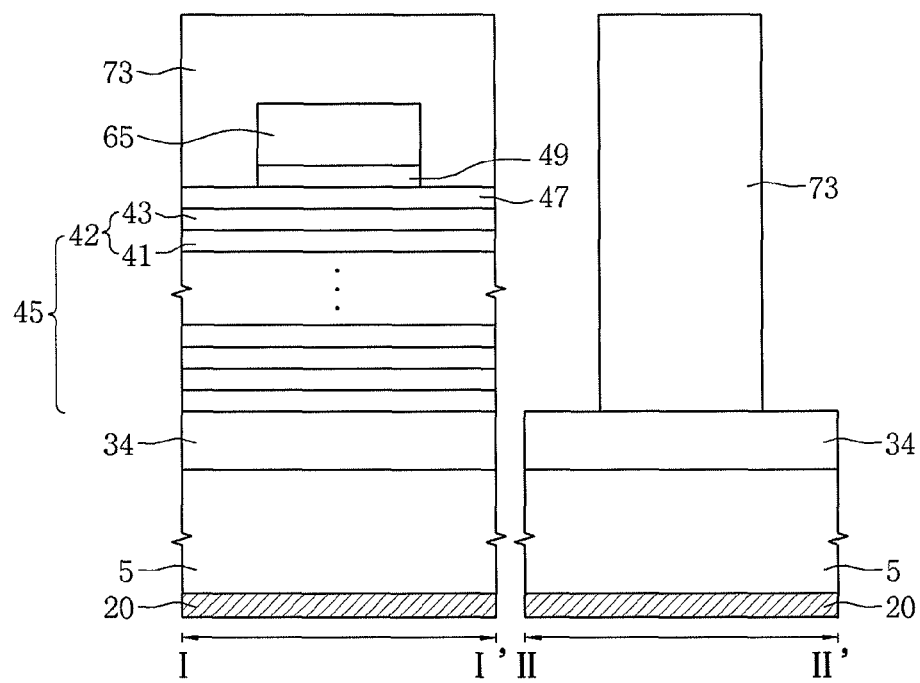

Referring to FIGS. 7A and 8I, a fabrication method of a photomask in accordance with an embodiment may include forming a third patterning mask 73 exposing a portion of the opaque layer 34 on the transparent region TR, and covering the reflective region RR (S155). The third patterning mask 73 may include, e.g., an electron beam resist or a photo resist.

Figure 8J:
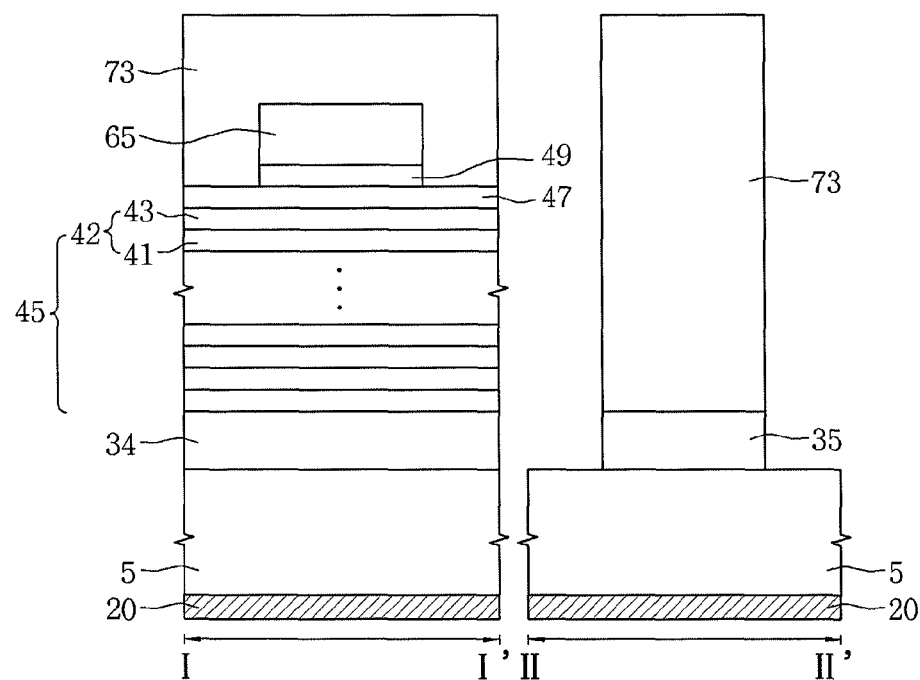

Referring to FIGS. 7A and 8J, a fabrication method of a photomask in accordance with an embodiment may include forming an opaque pattern 35 on the transparent region TR by removing the exposed portion of the opaque layer 34 using the third patterning mask 73 as an etching mask (S160). Then, a fabrication method of a photomask in accordance with the embodiment may include removing the third patterning mask 73 (S165).

Figure 9A:
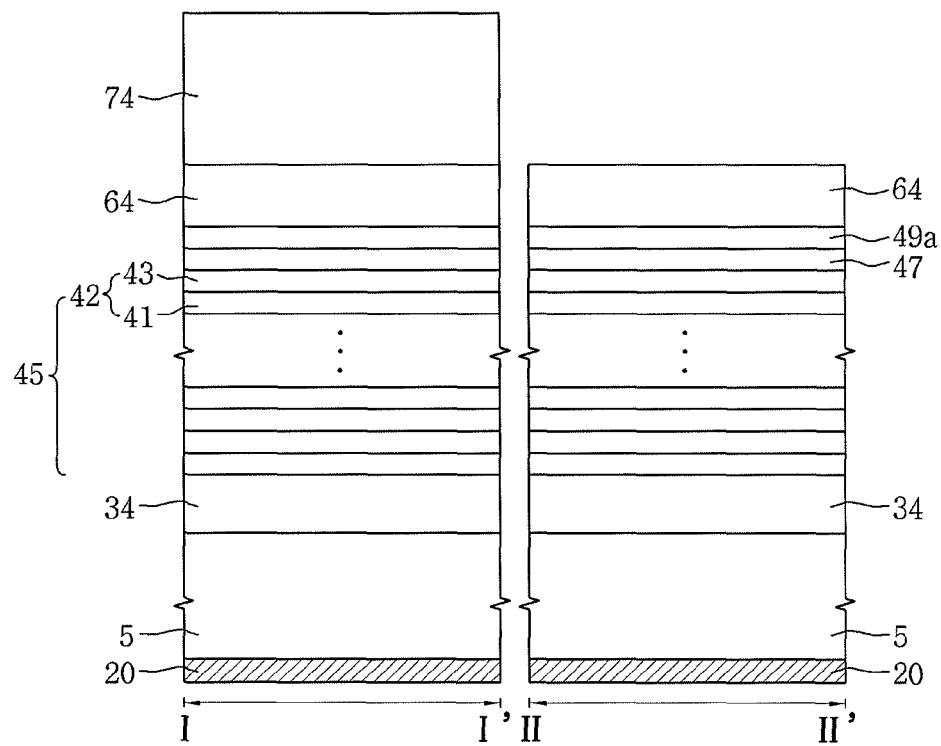

Referring to FIGS. 7B and 9A, a fabrication method of a photomask in accordance with an embodiment may include forming an opaque layer 34, a reflective layer 45, a capping layer 47, a buffer layer 49*a*, and an absorbing layer 64 on a photomask substrate 5 with reference to FIGS. 8A to 8D (S210), and forming a first patterning mask 74 on the absorbing layer 64 of the reflective region RR (S215). The first patterning mask 74 may cover the reflective region RR and expose the transparent region TR.

Figure 9B:
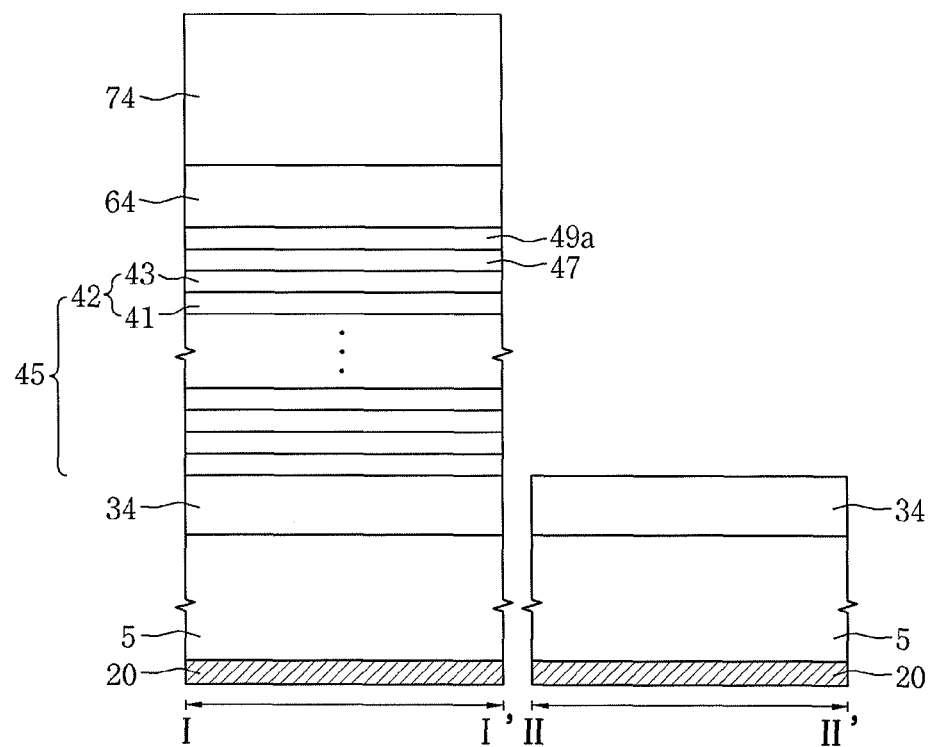

Referring to FIGS. 7B and 9B, a fabrication method of a photomask in accordance with an embodiment may include selectively removing the absorbing layer 64, buffer layer 49*a*, capping layer 47, and reflective layer 45 of the transparent region TR using the first patterning mask 74 as an etching mask (S220). A fabrication method of a photomask in accordance with an embodiment may include removing the absorbing layer 64 of the transparent region TR using the first patterning mask 74 as an etching mask, and then removing the buffer layer 49*a*, capping layer 47, and reflective layer 45 of the transparent region TR using the remaining absorbing layer 64 of the reflective region RR as an etching mask.

Figure 9C:
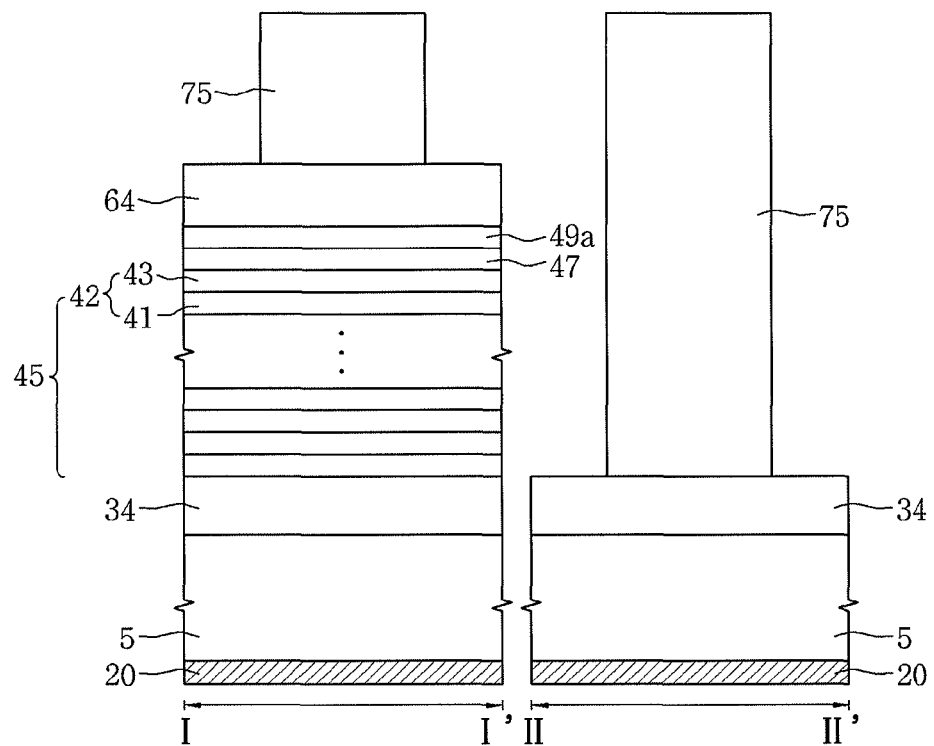

Referring to FIGS. 7B and 9C, a fabrication method of a photomask in accordance with an embodiment may include forming a second patterning mask 75 (S225). The second patterning mask 75 may be directly formed on the absorbing layer 64 in the reflective region RR, and/or directly formed on the opaque layer 34 in the transparent region TR.

Figure 9D:
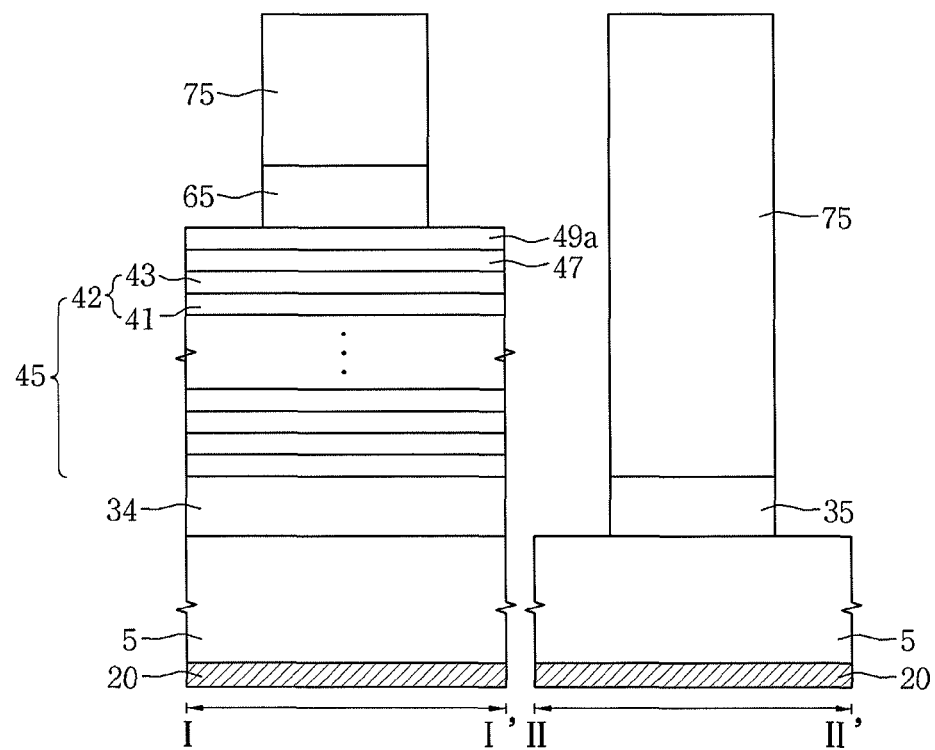

Referring to FIGS. 7B and 9D, a fabrication method of a photomask in accordance with an embodiment may include selectively removing the absorbing layer 64 and the opaque layer 34 using the second patterning mask 75 as an etching mask to form an absorbing pattern 65 and an opaque pattern 35 (S230). During the process, the buffer layer 49*a* may also be selectively removed to form a buffer pattern 49 (as illustrated in FIGS. 2A to 2C). In addition, a fabrication method of a photomask in accordance with an embodiment may include removing the second patterning mask 75 before or after forming the buffer pattern 49 (S235).

Figure 10A:
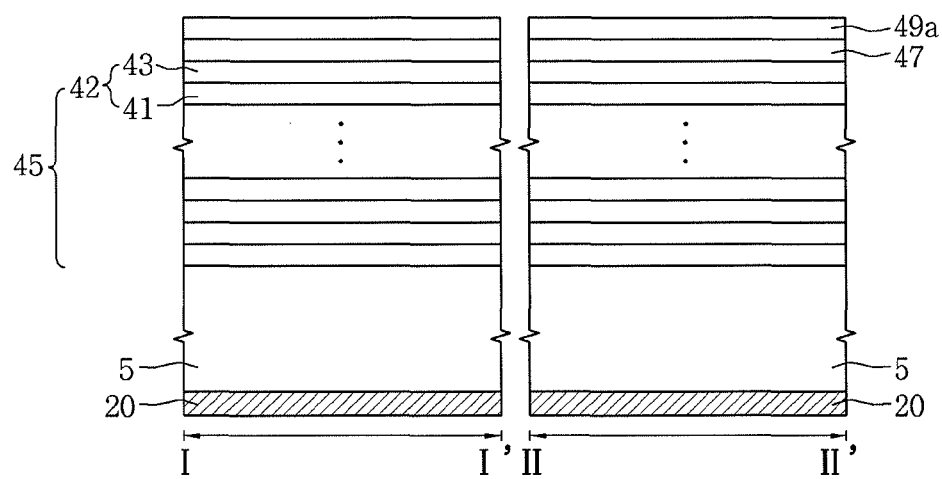

Referring to FIGS. 7C and 10A, a fabrication method of a photomask in accordance with an embodiment may include forming a reflective layer 45, a capping layer 47, and a buffer layer 49*a* on a photomask substrate 5 (S310).

Figure 10B:
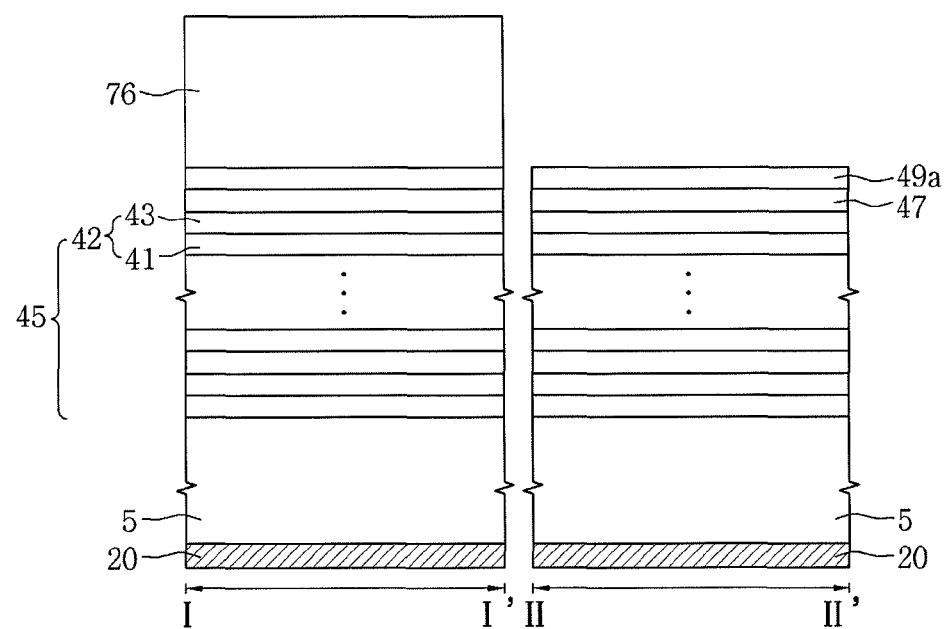

Referring to FIGS. 7C and 10B, a fabrication method of a photomask in accordance with an embodiment may include forming a first patterning mask 76 on the buffer layer 49*a* of the reflective region RR (S315). The first patterning mask 76 may include, e.g., an electron beam resist or a photo resist.

Figure 10C:
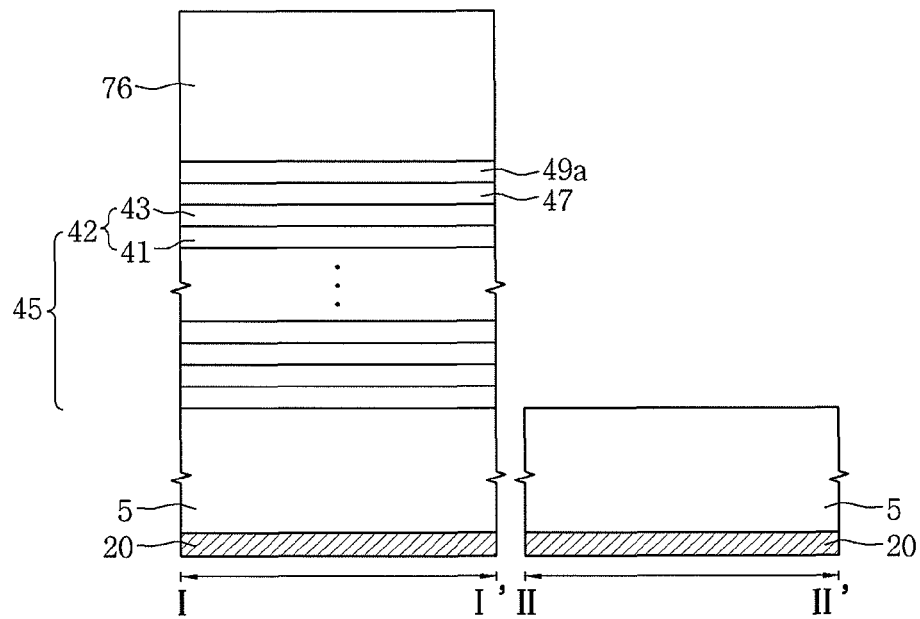

Referring to FIGS. 7C and 10C, a fabrication method of a photomask in accordance with an embodiment may include selectively removing the buffer layer 49*a*, capping layer 47, and reflective layer 45 of the transparent region TR using the first patterning mask 76 as an etching mask (S320). During the process, the photomask substrate 5 in the transparent region TR may be exposed. Then, the first patterning mask 76 may be removed.

Figure 10D:
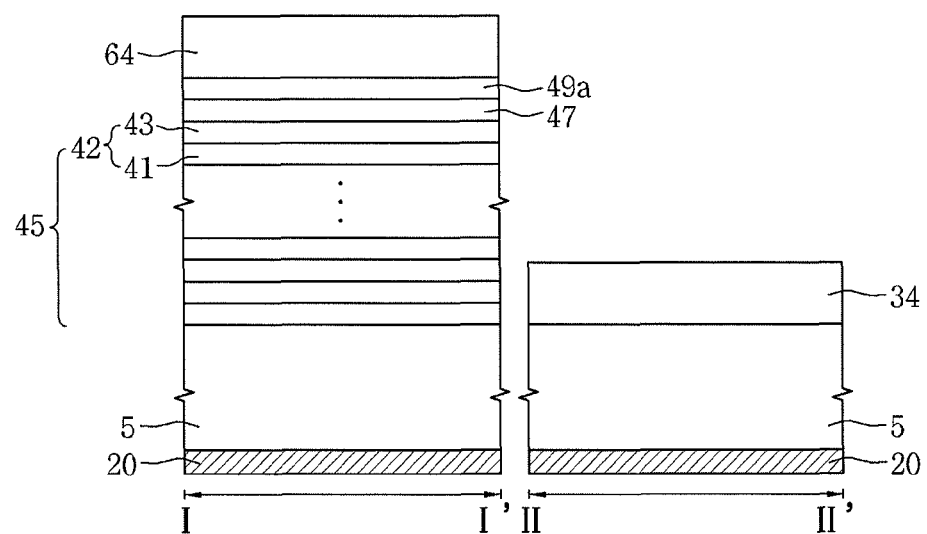

Referring to FIGS. 7C and 10D, a fabrication method of a photomask in accordance with an embodiment may include separately or simultaneously forming an absorbing layer 64 on the reflective region RR and an opaque layer 34 on the transparent region TR (S325). When the absorbing layer 64 and the opaque layer 34 include the same material, the absorbing layer 64 and the opaque layer 34 may be formed at the same time. When the absorbing layer 64 and the opaque layer 34 include different materials from each other, the absorbing layer 64 and the opaque layer 34 may be formed separately. In this example embodiment, the absorbing layer 64 and the opaque layer 34 are illustrated to have the same material.

Figure 10E:
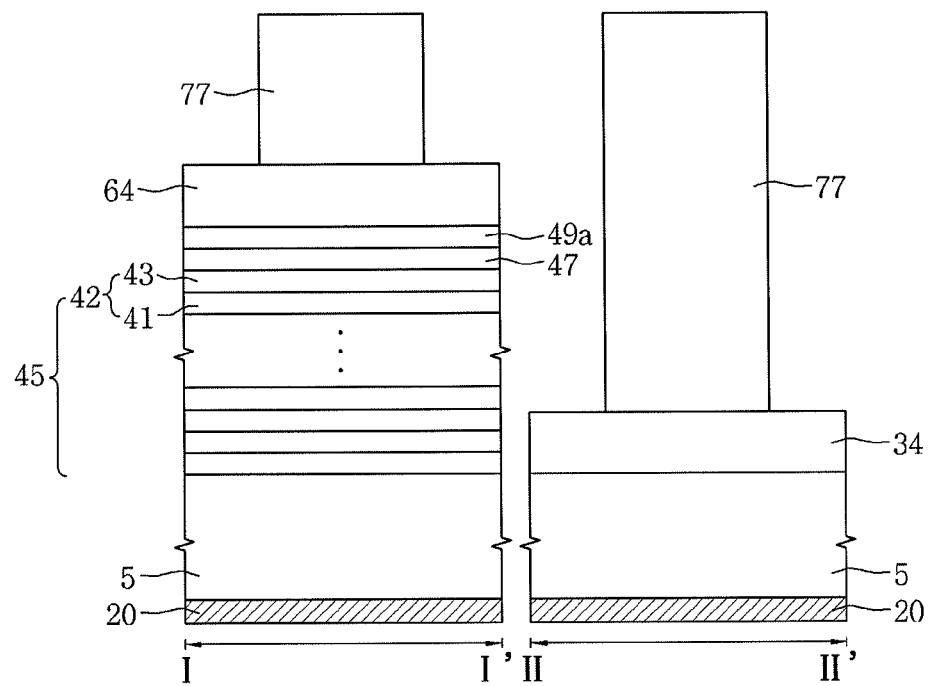

Referring to FIGS. 7C and 10E, a fabrication method of a photomask in accordance with an embodiment may include forming a second patterning mask 77 on the reflective region RR and the transparent region TR (S330). The second patterning mask 77 may include, e.g., an electron beam resist.

Figure 10F:
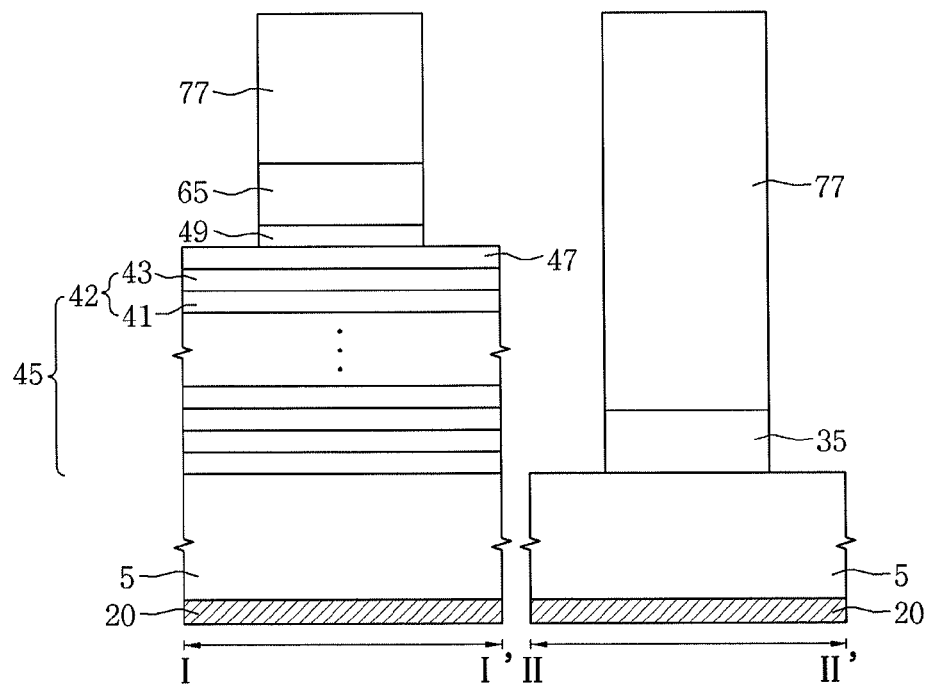

Referring to FIGS. 7C and 10F, a fabrication method of a photomask in accordance with an embodiment may include selectively removing the absorbing layer 64 and the opaque layer 34 using the second patterning mask 77 as an etching mask to form an absorbing pattern 65 and an opaque pattern 35 (S335). During the process, the buffer layer 49a may be selectively removed to form a buffer pattern 49. In addition, a fabrication method of a photomask in accordance with an embodiment may include removing the second patterning mask 77 before or after forming the buffer pattern 49 (S340).

Figure 11A:
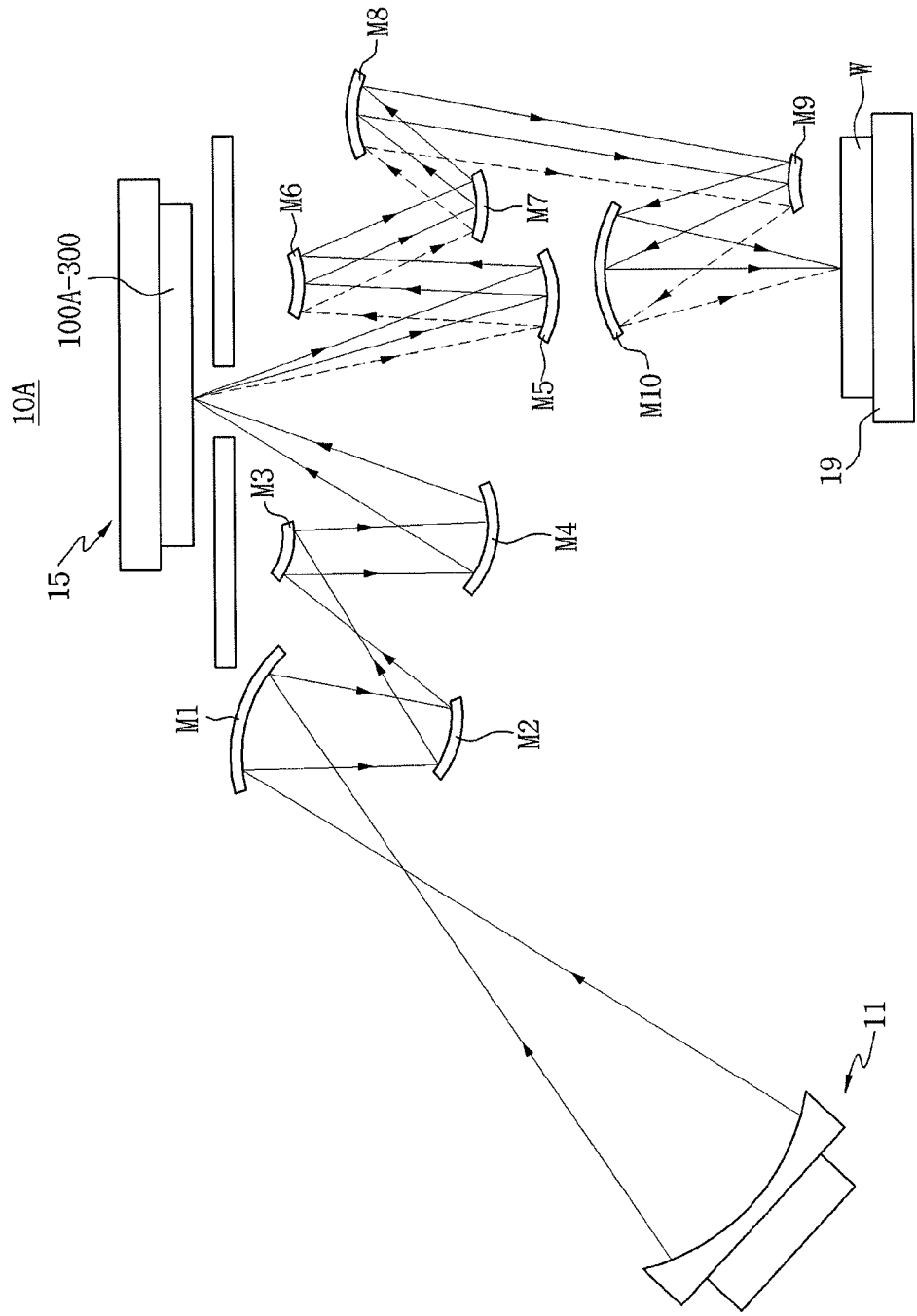
FIGS. 11A and 11B illustrate schematic views of an exemplary processes of performing respective photolithography processes in a reflective photolithography system using an EUV light and in a transmissive photolithography system using a DUV light, using a photomask in accordance with an embodiment.
Figure 11B:
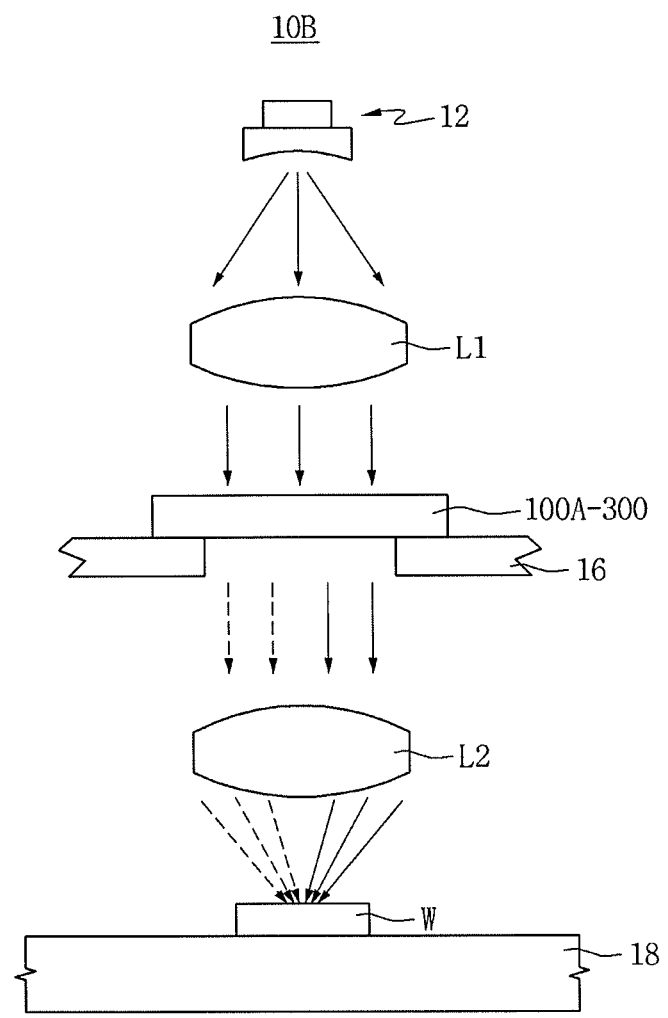

FIGS. 11A and 11B illustrate schematic views of an exemplary processes of performing respective photolithography processes in a reflective photolithography system using the EUV light and in a transmissive photolithography system using the DUV light, using a photomask in accordance with an embodiment.

Referring to FIG. 11A, in the reflective photolithography system 10A using the EUV light, a photolithography process may be performed using the photomask in accordance with an embodiment. The reflective photolithography system 10A may include an EUV light source 11, illuminating mirrors M1-M4, a photomask stage 15, projecting mirrors M5-M10, and a wafer stage 19. The EUV light generated from the EUV light source 11 may be irradiated to the photomask 100A-300 mounted on a bottom surface of the photomask stage 15 through the illuminating mirrors M1-M4. The EUV light may be reflected from the photomask 100A-300 to be projected to a wafer W mounted on the wafer stage 19 through the projecting mirrors M5-M10. The light irradiated to the photomask 100A-300 in accordance with an embodiment may be selectively reflected. For example, only the EUV light irradiated to the reflective region RR may be reflected. The EUV light irradiated to the transparent region TR of the photomask 100A-300 in accordance with an embodiment may be not reflected but absorbed. In FIG. 11A, a path marked with a dotted line means that the EUV light has been irradiated to the transparent region TR of the photomask 100A-300 and thus has not been reflected. That is, the dotted line means that the EUV light does not pass to the wafer W. The EUV light reflected from the photomask 100A-300 may be irradiated to the wafer W along arrows in solid lines, having optical information based on the reflective layer 45 and absorbing pattern 65 of the reflective region RR.

Referring to FIG. 11B, in the transmissive photolithography system 10B using the DUV light, a photolithography process may be performed using the photomask in accordance with an embodiment. The transmissive photolithography system 10B may include a DUV light source 12, a condensing lens L1, a photomask stage 16, a projecting lens L2, and a wafer stage 18. The DUV light generated from the DUV light source 12 may be irradiated to a back surface of the photomask 100A-300 through the condensing lens L1. The DUV light may selectively pass through the transparent region TR of the photomask 100A-300 to be irradiated to a wafer W through the projecting lens L2. In FIG. 11B, paths marked with dotted lines mean that the DUV light has been irradiated to a back surface of the reflective RR of the photomask 100A-300 in accordance with an embodiment, and thus is not transmitted by the photomask 100A-300. In other words, the dotted lines mean that the DUV light does not pass to the wafer W. The DUV light transmitted from the transparent region TR of the photomask 100A-300 may be irradiated to the wafer W along arrows in solid lines, having optical information based on the opaque pattern 35.

Figure 12A:
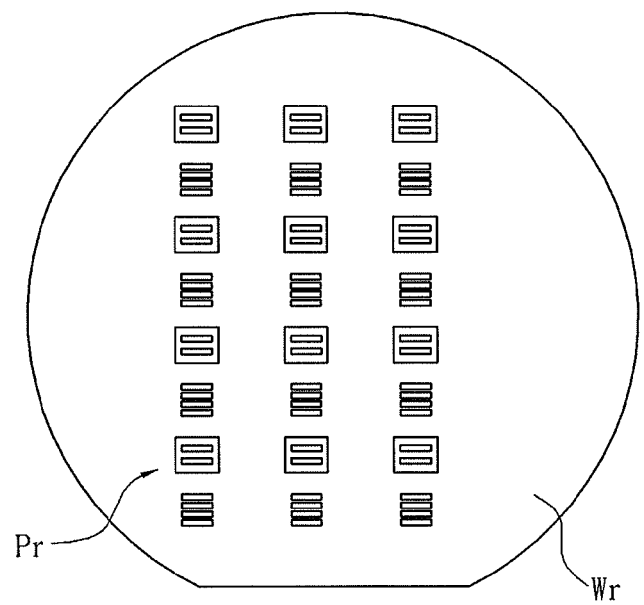
FIG. 12A illustrates a schematic view of optical image information formed on a wafer by a reflective photolithography system using an EUV light.
Figure 12B:
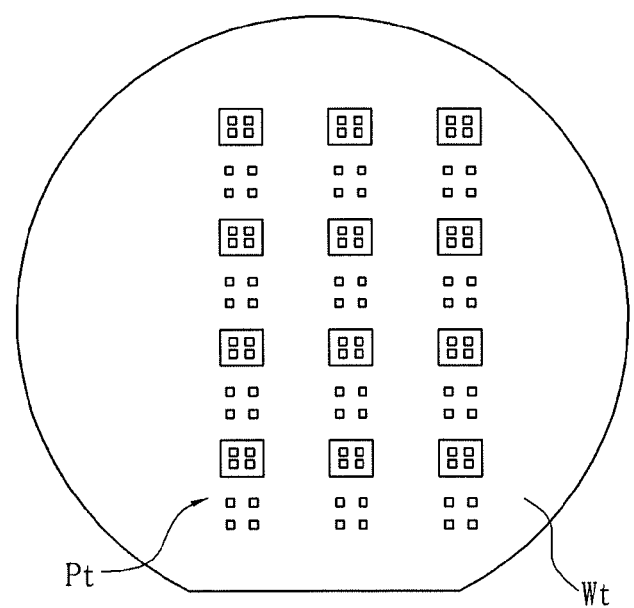
FIG. 12B illustrates a schematic view of optical image information formed on a wafer by a transmissive photolithography system using a DUV light.
Figure 12C:
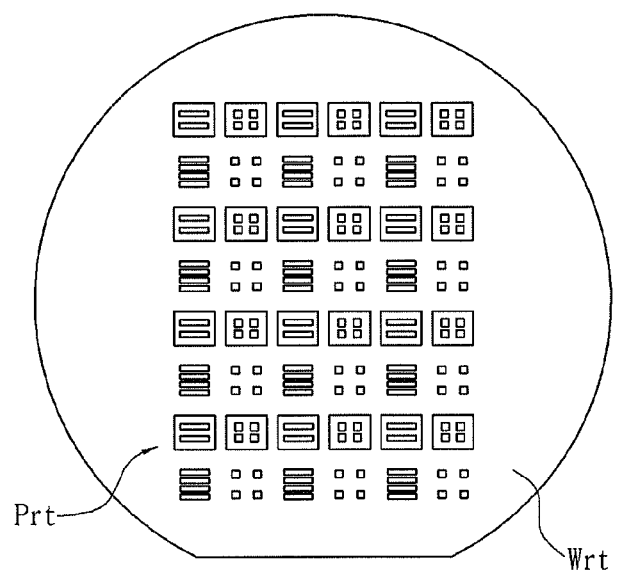
FIG. 12C illustrates a schematic view of optical image information formed on a wafer by both a reflective photolithography system using an EUV light and a transmissive photolithography system using a DUV.

FIG. 12A is a schematic view illustrating optical image information formed on a wafer Wr by the reflective photolithography system 10A using the EUV light, and FIG. 12B is a schematic view illustrating optical image information formed on a wafer Wt by the transmissive photolithography system 10B using the DUV light. FIG. 12C is a schematic view illustrating optical image information formed on a wafer Wrt by the reflective photolithography system 10A using the EUV light, and the transmissive photolithography system 10B using the DUV light.

Referring to FIG. 12A, the wafer Wr exposed by the reflective photolithography system 10A using the EUV light may have optical image information Pr based on the reflective region RR. Referring to FIG. 12B, the wafer Wt exposed by the transmissive photolithography system 10B using the DUV light may have optical image information Pt based on the transparent region TR. Referring to FIG. 12C, the wafer Wrt exposed by both of the reflective photolithography system 10A using the EUV light, and the transmissive photolithography system 10B using the DUV light, using the photomask in accordance with an embodiment, may have optical image information Prt based on both of the reflective region RR and the transparent region TR. Accordingly, when the photomask in accordance with an embodiment is used, misalignment such as overlay between the reflective photolithography system 10A using the EUV light, and the transmissive photolithography system 10B using the DUV light may be corrected with increased precision.

Figure 13A:
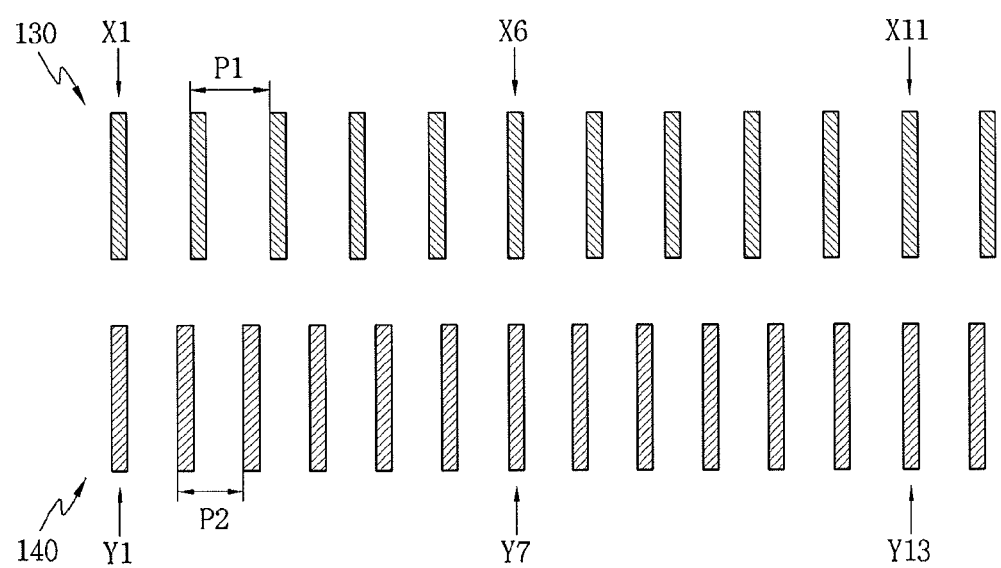
FIGS. 13A, 13B, and 13C illustrate plan views of exemplary overlay measurement patterns formed on a wafer exposed by both a reflective photolithography system using an EUV light and a transmissive photolithography system using a DUV light through a photomask in accordance with an embodiment.
Figure 13B:
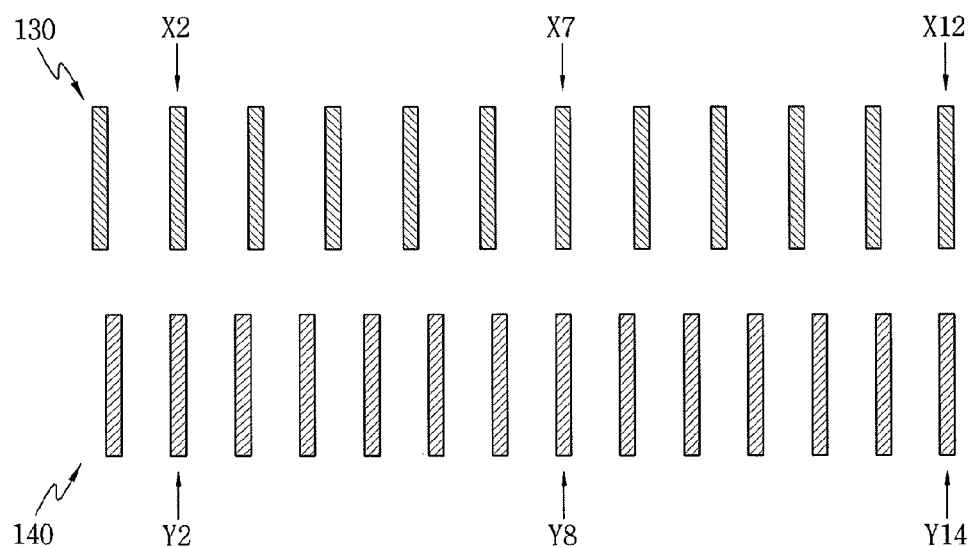
Figure 13C:
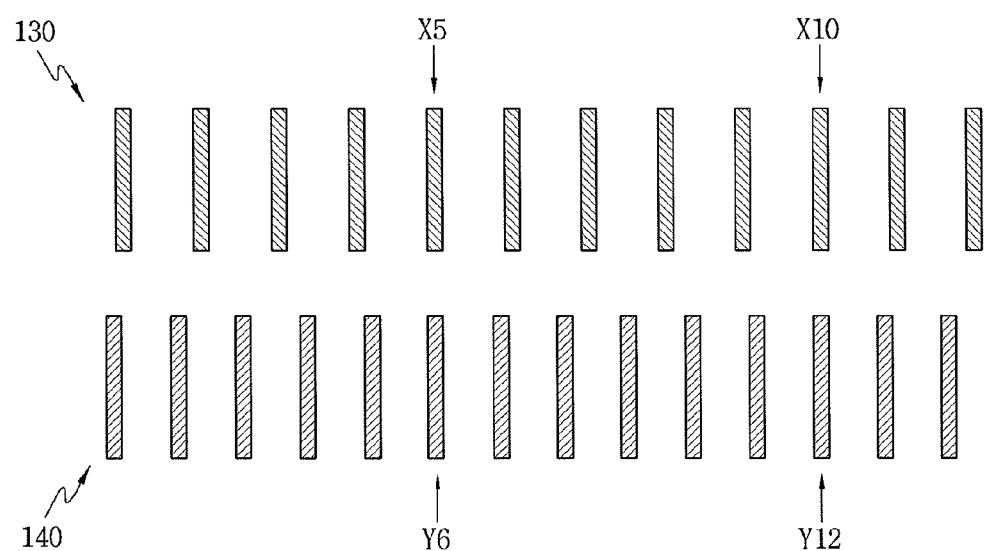

FIGS. 13A to 13C illustrate views of exemplary overlay measurement patterns 130 and 140 formed on the wafer W exposed by both of the reflective photolithography system 10A using the EUV light, and the transmissive photolithography system 10B using the DUV light through the photomask in accordance with an embodiment. For example, FIG. 13A illustrates a case in which the overlay error is zero, FIG. 13B illustrates a case in which the overlay error has a positive value (+), and FIG. 13C illustrates a case in which the overlay error value has a negative value (−).

Referring to FIGS. 13A to 13C, the overlay measurement patterns 130 and 140 may include upper patterns 130 and lower patterns 140 which have a plurality of parallel bars arranged in a horizontal direction. For example, the upper patterns 130 may be optical patterns formed by being exposed in the transmissive photolithography system 10B using the DUV light, and the lower patterns 140 may be optical patterns formed by being exposed in the reflective photolithography system 10A using the EUV light. For example, the upper patterns 130 may be arranged at a first pitch P1, and the lower patterns 140 may be arranged at a second pitch P2. The patterns illustrated in FIGS. 13A to 13C are exemplary, and other suitable optical patterns may be formed.

Referring to FIG. 13A, when the overlay error is zero, the first bar patterns X1 and Y1 of the upper patterns 130 and lower patterns 140 respectively may be assumed as reference points or reference lines. For example, when the reference points are placed on the same horizontal coordinate, the sixth bar pattern X6 of the upper patterns 130 and the seventh bar pattern Y7 of the lower patterns 140, and the eleventh bar pattern X11 of the upper patterns 130 and the thirteenth bar pattern Y13 of the lower patterns 140, may be arranged at the same respective horizontal coordinates.

Referring to FIG. 13B, when the overlay error has a positive value, the lower patterns 140 may be moved to, and formed at the right relative to, the upper pattern 130. For example, when the second bar pattern X2 of the upper patterns 130 and the second bar pattern Y2 of the lower patterns 140, the seventh bar pattern X7 of the upper patterns 130 and the eight bar pattern Y8 of the lower patterns 140, and the twelfth bar pattern X12 of the upper patterns 130 and the fourteenth bar pattern Y14 of the lower patterns 140 are respectively arranged at the same horizontal coordinates, the overlay error may be assumed as +1.

Referring to FIG. 13C, when the overlay error has a negative value, the lower patterns 140 may be moved to, and formed at the left relative to, the upper patterns 130. For example, when the fifth bar pattern X5 of the upper patterns 130 and the sixth bar pattern Y6 of the lower patterns 140, and the tenth bar pattern X10 of the upper patterns 130 and the twelfth bar pattern Y12 of the lower patterns 140 are respectively arranged at the same horizontal coordinates, the overlay error may be assumed as −1.

The first pitch P1 and the second pitch P2 may be set to different values and those values may be finely controlled. The overlay may be accurately measured and the accuracy of the measured overlay may be improved depending on the degree of subdivision. Each overlay error may correspond to a predetermined value. For example, when the overlay error is ±1, the overlay may be expected to have an offset in the range of about ±16 nm.

Referring again to FIGS. 13A to 13C, each of the bar patterns may not be located in the same horizontal coordinate. That is, although the relative horizontal coordinates of the respective bar patterns of the upper and lower patterns 130 and 140 have been measured in the embodiment described above, the overlay may be obtained by independently measuring each horizontal coordinate. However, in order to easily understand the embodiments, specific bar patterns may be assumed to be located at the same horizontal coordinate.

Figure 14:
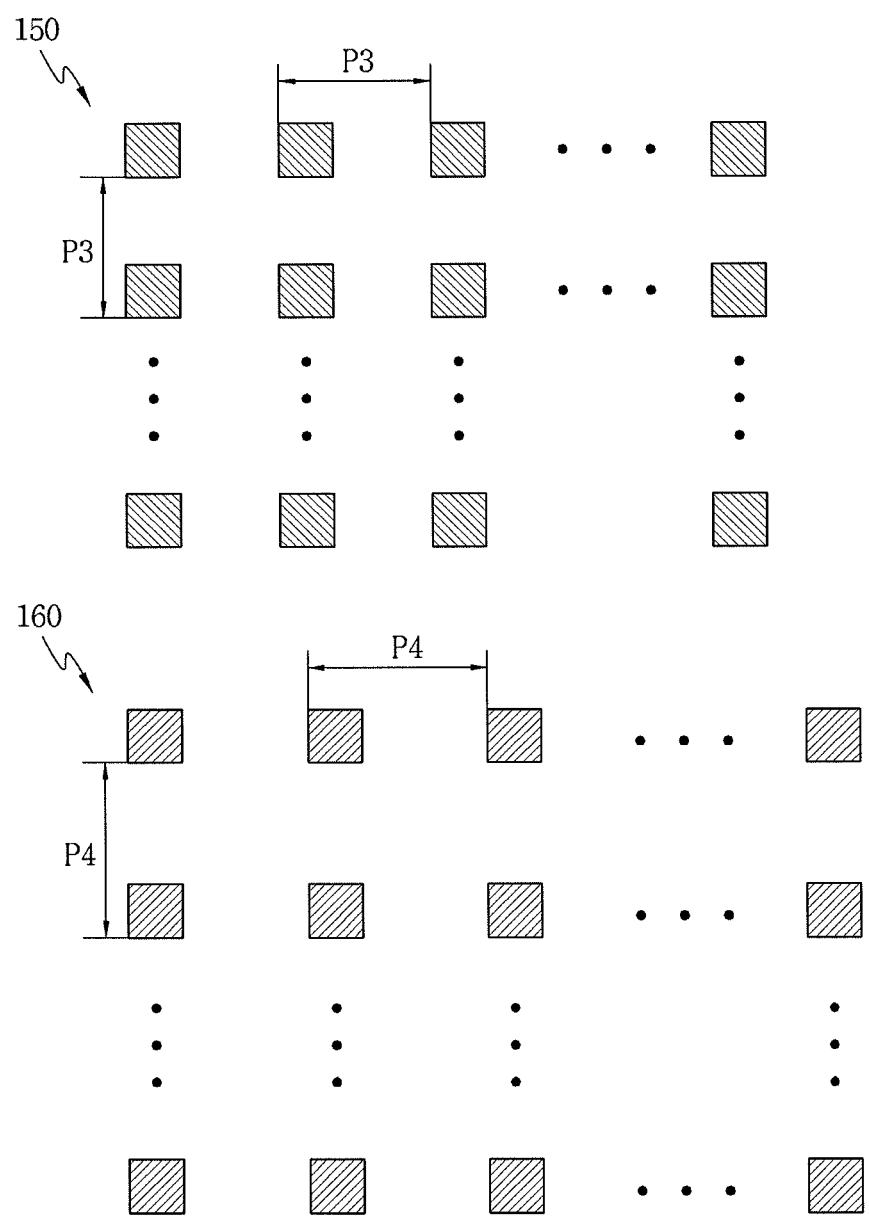
FIG. 14 illustrates a plan view of an exemplary overlay measurement pattern in which horizontal coordinates and/or vertical coordinates may be measured at the same time.

FIG. 14 illustrates a plan view of exemplary measurement patterns in which the horizontal coordinates and/or the vertical coordinates are able to be measured at the same time. Referring to FIG. 14, the overlay measurement patterns may include upper patterns 150 and lower patterns 160 having a plurality of arranged island patterns. The upper patterns 150 may be arranged at a third pitch P3, and the lower patterns 160 may be arranged at a fourth pitch P4. The measurement method discussed above with reference to FIGS. 13A to 13C may be similarly applied to FIG. 14.

By way of summary and review, EUV and DUV exposure apparatuses may be used to develop semiconductor devices. For example, a reflective photolithography system may process a wafer using an EUV light, and a transmissive photolithography system may process a wafer using a DUV light. A reflective photolithography system using the EUV light may process a wafer using a reflective photomask, and a transmissive photolithography system using the DUV light may process a wafer using a transmissive photomask. The EUV and DUV exposure apparatuses may form elements of semiconductor devices using different light sources.

Overlay matching works of the EUV and DUV exposure apparatuses may be performed using different photomasks. However, if two or more photomasks are used for the overlay matching works, it may be difficult to minimize overlay errors based on the conditions of the EUV and DUV exposure apparatuses. Unless the overlay matching works on the EUV and DUV exposure apparatuses precede other processes, the elements of the semiconductor devices may generate an electrical short in the semiconductor devices depending on the extent of the overlay errors of the EUV and DUV exposure apparatuses.

The foregoing conditions may be circumvented by use of photomasks according to the embodiments disclosed herein. Such photomasks may be used in both of the photolithography system using the EUV light and the photolithography system using the DUV light. That is, an optical pattern or a material pattern may be formed using the same photomask on the same wafer by performing two photolithography processes in two respective photolithography systems. The optical pattern or material pattern may be simultaneously formed by the photolithography system using the EUV light and by the photolithography system using the DUV light. Accordingly, the photomasks may be used for measuring, and accurately correcting, overlay errors between the photolithography system using the EUV light and the photolithography system using the DUV light.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. In the claims, if means-plus-function clauses are recited, the means-plus-function clauses are intended to cover the structures described herein as performing the recited function, and not only structural equivalents but also equivalent structures. Accordingly, it will be understood by those of skill in the art that various changes in form and details may be made without departing from the spirit and scope of the present invention as set forth in the following claims.

What is claimed is:

1. A photomask, comprising:
   a photomask substrate;
   a reflective layer for reflecting an EUV light, the reflective layer being on a front surface of a first region of the photomask substrate;
   an absorbing pattern for absorbing the EUV light, the absorbing pattern being on the reflective layer; and
   an opaque pattern for blocking a DUV light, the opaque pattern being directly on a front surface of a second region of the photomask substrate.

2. The photomask as claimed in claim 1, wherein the photomask substrate is transparent to the DUV light.

3. The photomask as claimed in claim 1, wherein the photomask substrate is transparent to the EUV light.

4. The photomask as claimed in claim 1, wherein the absorbing pattern selectively exposes the reflective layer.

5. The photomask as claimed in claim 1, wherein the opaque pattern selectively exposes a surface of the photomask substrate.

6. The photomask as claimed in claim 1, wherein the opaque pattern absorbs the EUV light.

7. The photomask as claimed in claim 6, wherein the absorbing pattern and the opaque pattern include a metal.

8. The photomask as claimed in claim 1, further comprising an opaque layer interposed between the photomask substrate and the reflective layer.

9. The photomask as claimed in claim 8, wherein the opaque layer and the opaque pattern have a same vertical thickness and a same material.

10. The photomask as claimed in claim 1, wherein the reflective layer includes a stack of unit reflective layers, and each of the unit reflective layers includes a first reflective material layer and a second reflective material layer.

11. The photomask as claimed in claim 1, further comprising a capping layer between the reflective layer and the absorbing pattern, the capping layer fully covering the reflective layer.

12. The photomask as claimed in claim 11, further comprising a buffer pattern between the capping layer and the absorbing pattern, wherein a side of the buffer pattern is vertically aligned with a side of the absorbing pattern.

13. The photomask as claimed in claim 1, further comprising a conductive layer on a back surface of the first region of the photomask substrate.

14. A photomask, comprising:
a photomask substrate;
a stack of reflective layers on a front surface of the photomask substrate, the stack of reflective layers fully covering a first region of the front surface of the photomask substrate;
an opaque pattern on the front surface of the photomask substrate, the opaque pattern selectively exposing a second region of the front surface of the photomask substrate;
an absorbing pattern on the stack of the reflective layers, the absorbing pattern selectively exposing the stack of reflective layers; and
a conductive layer on a back surface of the photomask substrate,
wherein:
the photomask substrate is transparent to an EUV light and a DUV light;
the absorbing pattern, the stack of reflective layers, and the opaque pattern are opaque to the DUV light;
the stack of reflective layers reflect the EUV light; and
the absorbing pattern and the opaque pattern absorb the EUV light.

15. The photomask as claimed in claim 14, further comprising an opaque layer between the front surface of the photomask substrate and the stack of the reflective layers.

16. The photomask as claimed in claim 14, wherein:
each of the reflective layers includes a first reflective material layer and a second reflective material layer, and
each of the reflective layers has a thickness of about 6.075 to about 7.425 nm.

17. The photomask as claimed in claim 14, wherein the opaque pattern and the absorbing pattern have a same vertical thickness and a same material.

18. A photomask, comprising:
a photomask substrate having a front surface;
a first region on the front surface of the photomask substrate that reflects an EUV light and blocks a DUV light;
a second region on the front surface of the photomask substrate that absorbs the EUV light and blocks the DUV light;
a third region on the front surface of the photomask substrate that is transmissive to the DUV light; and
a fourth region on the front surface of the photomask substrate that blocks the DUV light.

19. The photomask as claimed in claim 18, wherein:
the first region is directly adjacent to the second region, and
the third region is directly adjacent to the fourth region.

20. The photomask as claimed in claim 18, wherein the third region is transmissive to the EUV light and the fourth region absorbs the EUV light.

* * * * *